(12) United States Patent
Popp et al.

(10) Patent No.: US 9,711,568 B2
(45) Date of Patent: Jul. 18, 2017

(54) ORGANIC OPTOELECTRONIC COMPONENT AND METHOD FOR OPERATING THE ORGANIC OPTOELECTRONIC COMPONENT

(71) Applicant: OSRAM OPTO SEMICONDUCTORS GMBH, Regensburg (DE)

(72) Inventors: Michael Popp, Freising (DE); Marc Philippens, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/432,573

(22) PCT Filed: Oct. 24, 2013

(86) PCT No.: PCT/EP2013/072320
§ 371 (c)(1),
(2) Date: Mar. 31, 2015

(87) PCT Pub. No.: WO2014/067853
PCT Pub. Date: May 8, 2014

(65) Prior Publication Data
US 2015/0270313 A1    Sep. 24, 2015

(30) Foreign Application Priority Data

Nov. 2, 2012    (DE) .................. 10 2012 220 056

(51) Int. Cl.
*H05B 37/02*    (2006.01)
*H01L 27/28*    (2006.01)
(Continued)

(52) U.S. Cl.
CPC ........ *H01L 27/288* (2013.01); *H01L 27/3269* (2013.01); *H01L 51/5206* (2013.01);
(Continued)

(58) Field of Classification Search
CPC ......... H01L 2924/00; H01L 2924/0002; H01L 27/288; H01L 2251/5361;
(Continued)

(56) References Cited

U.S. PATENT DOCUMENTS 7,460,222 B2    12/2008    Kalveram et al.
7,859,621 B2    12/2010    Zhang et al.
(Continued)

FOREIGN PATENT DOCUMENTS

CN    1364285 A    8/2002
EP    1467408 A2    10/2004
(Continued)

*Primary Examiner* — Jany Richardson
(74) *Attorney, Agent, or Firm* — Slater Matsil, LLP

(57) ABSTRACT

An organic optoelectronic component and a method for operating the organic optoelectronic component are disclosed. In an embodiment an organic optoelectronic component includes at least one organic light emitting element, at least one first organic light detecting element including at least one first organic light detecting layer, and at least one second organic light detecting element including at least one second organic light detecting layer, wherein the at least one organic light emitting element, the at least one first organic light detecting element and the at least one second light detecting element are arranged laterally on a common substrate, wherein the at least one first organic light detecting element is configured to detect ambient light, and wherein the at least one second organic light detecting layer of the at least one second organic light detecting element is arranged between two non-transparent layers.

19 Claims, 14 Drawing Sheets

(51) Int. Cl.
*H05B 33/08* (2006.01)
*H01L 27/32* (2006.01)
*H01L 51/52* (2006.01)

(52) U.S. Cl.
CPC ...... *H01L 51/5221* (2013.01); *H01L 51/5253* (2013.01); *H01L 51/5262* (2013.01); *H05B 33/0896* (2013.01); *H05B 37/0218* (2013.01); *H01L 2251/5361* (2013.01); *H01L 2251/562* (2013.01)

(58) Field of Classification Search
CPC ....... H01L 2924/12044; H01L 27/3269; H01L 27/3225; H05B 33/0896; H05B 37/0218
See application file for complete search history.

(56) References Cited

U.S. PATENT DOCUMENTS

| | | |
|---|---|---|
| 2001/0035848 A1 | 11/2001 | Johnson et al. |
| 2003/0214240 A1 | 11/2003 | Lee et al. |
| 2004/0031965 A1 | 2/2004 | Forrest et al. |
| 2006/0264143 A1 | 11/2006 | Lee et al. |
| 2007/0051945 A1 | 3/2007 | Nakayama et al. |
| 2008/0230792 A1 | 9/2008 | Jiang et al. |
| 2009/0134309 A1 | 5/2009 | Leo et al. |
| 2010/0201275 A1 | 8/2010 | Cok et al. |
| 2011/0042766 A1 | 2/2011 | Kurokawa et al. |
| 2011/0284721 A1 | 11/2011 | Iwabuchi et al. |
| 2012/0056205 A1 | 3/2012 | Allard et al. |
| 2012/0061689 A1 | 3/2012 | Yan et al. |
| 2012/0091923 A1 | 4/2012 | Kastner-Jung et al. |
| 2013/0105823 A1 | 5/2013 | Kurokawa |
| 2014/0021491 A1 | 1/2014 | Meng et al. |

FOREIGN PATENT DOCUMENTS

| | | |
|---|---|---|
| EP | 2065698 A1 | 6/2009 |
| JP | 2003150117 A | 5/2003 |
| JP | 200781203 A | 3/2007 |
| WO | 0169583 A1 | 9/2001 |
| WO | 2004048881 A2 | 6/2004 |
| WO | 2004088627 A1 | 10/2004 |
| WO | 2010066245 A1 | 6/2010 |

FIG. 13A
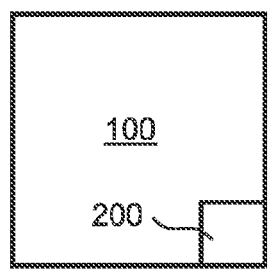
FIG. 13B
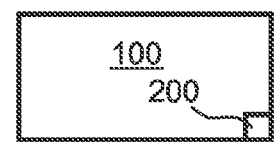
FIG. 13C
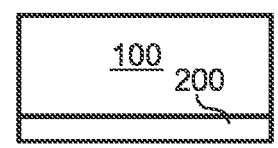
FIG. 14A
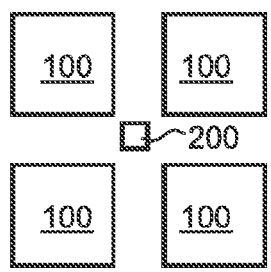
FIG. 13D
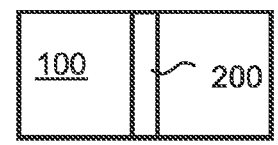
FIG. 14B
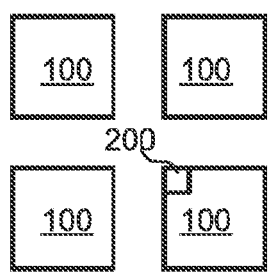
FIG. 13E

ORGANIC OPTOELECTRONIC COMPONENT AND METHOD FOR OPERATING THE ORGANIC OPTOELECTRONIC COMPONENT

This patent application is a national phase filing under section 371 of PCT/EP2013/072320, filed Oct. 24, 2013, which claims the priority of German patent application 10 2012 220 056.8, filed Nov. 2, 2012, each of which is incorporated herein by reference in its entirety.

TECHNICAL FIELD

An organic optoelectronic component and a method for operating the organic optoelectronic component are specified.

BACKGROUND

In illuminated environments, changed ambient conditions can change the illumination conditions or brightnesses. By way of example, the ambient conditions can change with regard to the current illumination, which corresponds to short-term processes, and as a result of ageing processes in the luminous sources used, which corresponds to long-term processes. Changed ambient conditions with regard to the illumination arise, for example, in the case of changed light incidence through windows into an illuminated room at different times of day. Surface light sources such as an organic light emitting diode (OLED), for instance, can furthermore be subject to ageing processes, as a result of which the luminance in total decreases over time depending on the OLED layer construction and processing. The decrease in the luminance can be caused, for example, by elevated temperatures which can occur during operation and can damage the organic materials.

In order to keep the luminance in the environment of a luminous source such as a surface light source, for instance, constant over time, the light emitted by the luminous source can be regulated, for example, by means of manual dimming or by means of an electronic circuit which controls the luminous source on the basis of a measurement signal from one or a plurality of externally connected sensors. As external sensors it is possible to use, for example, photodiodes, photoconductors, phototransistors or photothyristors for detecting the entire radiation power emitted by the luminous source at a preselected location, and, by means of an external interconnection or wiring, they can be part of a control of the luminous source. However, such a possibility usually requires a high complexity and causes additional costs. Manual dimming, by contrast, enables only imprecise coordination with lighting conditions actually present and causes an unnecessary waste of energy and, under certain circumstances, incorrect illumination conditions.

Since the known control possibilities for surface light sources have a high interconnection complexity or cannot be automated, an automatic readjustment of the luminance is not possible without considerable additional outlay.

SUMMARY OF THE INVENTION

In accordance with at least one embodiment, an organic optoelectronic component comprises at least one organic light emitting element comprising an organic functional layer stack having at least one organic light emitting layer between two electrodes. In particular, the at least one organic light emitting element is embodied as organic light emitting diode (OLED) which can emit visible light during operation through at least one of the electrodes. For this purpose, at least one of the electrodes is embodied as transparent.

Here and hereinafter, "transparent" denotes a layer which is transmissive to visible light. In this case, the transparent layer can be clearly translucent or at least partly light scattering and/or partly light absorbing, such that a layer designated as transparent can, for example, also be diffusely or milkily translucent. Particularly preferably, a layer designated here as transparent is embodied as transmissive to visible light as far as possible in such a way that in particular the absorption of light generated in the organic light emitting element is as low as possible.

By way of example, a transparent electrode can be composed of a transparent conductive oxide (TCO), graphene, a transparent metal or metallic network structures or can comprise such a material. The other of the two electrodes between which the organic functional layer stack of the organic light emitting element is situated can be embodied as reflective and comprise a metal, for example. As an alternative thereto, it is also possible for both electrodes to be embodied as transparent. In this case, the organic light emitting element can be embodied in particular as a transparent OLED.

The organic optoelectronic component furthermore comprises at least one first organic light detecting element and at least one second organic light detecting element each comprising at least one organic light detecting layer. In particular, the organic light detecting elements can be designed to convert light incident on the respective at least one organic light detecting layer into an electrically measurable signal, for instance a voltage, a current or an electrical resistance.

Furthermore, the organic optoelectronic component comprises a common substrate for the at least one organic light emitting element, the at least one first organic light detecting element and the at least one second organic light detecting element, which are arranged in particular on the common substrate in laterally adjacent area regions. The organic light emitting element and the organic light detecting elements are furthermore arranged in a same plane as a result of the common arrangement on the same substrate in laterally adjacent area regions, wherein the organic light emitting element and the organic light detecting elements in each case directly adjoin the substrate.

The common substrate can be in particular the sole substrate of the organic optoelectronic component. The functional layer stacks and the electrodes of the organic light emitting and light detecting elements of the organic optoelectronic component are in this case applied successively or simultaneously in particular on the common substrate, such that the common substrate is that substrate which is necessary and provided for producing the organic light emitting and light detecting elements. In other words, the organic light emitting and light detecting elements are not produced on dedicated substrates and then arranged on the common substrate, but rather are produced on the common substrate. Consequently, in this case, no further substrate is arranged in particular between the common substrate and the organic functional layers of the organic light emitting and light detecting elements.

Here and hereinafter, "lateral" denotes a direction parallel to the main extension plane of the common substrate. A lateral direction is thus directed, for example, perpendicularly to the stacking direction of the electrodes and of the organic functional layer stack of the at least one organic light emitting element.

The at least one first organic light detecting element is designed to detect ambient light. The at least one organic light detecting layer of the at least one second organic light detecting element is arranged between two non-transparent layers, which shade the at least one light detecting layer of the at least one second light detecting element from ambient light. In order to achieve an effective shading of the at least one organic light detecting layer of the at least one second organic light detecting element from ambient light, the at least one organic light detecting layer is preferably arranged between the two non-transparent layers in the stacking direction, such that in the stacking direction one non-transparent layer is arranged below and one non-transparent layer above the at least one organic light detecting layer.

Hereinafter, "ambient light" here denotes light, in particular visible light, which can impinge from outside on the organic optoelectronic component and thus also on the organic light detecting elements, that is to say which is not guided within the organic optoelectronic component by means of internal scattering and/or light guiding effects from the at least one light emitting element to the at least one first and second light detecting element.

In particular, ambient light which is shaded by the non-transparent layers can also denote light having spectral components which correspond to the absorption spectrum of the at least one organic light detecting layer of the at least one second light detecting element. In other words, the non-transparent layers are designed in particular in such a way that they shade the at least one organic light detecting layer from at least that portion of the ambient light which corresponds to the absorption spectrum of the at least one organic light detecting layer and furthermore to the absorption spectrum of the at least one second organic light detecting element.

By virtue of the fact that the at least one organic light detecting layer of the at least one second light detecting element is shaded from the ambient light by the two non-transparent layers, what is achieved, in particular, is that the portion—passing to the at least one organic light detecting layer of the at least one second light detecting element—of ambient light radiated onto the at least one second light detecting element from outside is reduced in comparison with an organic light detecting element without the two non-transparent layers. Preferably, the shading brings about a reduction of greater than or equal to 90% and particularly preferably of greater than or equal to 99% or even greater than or equal to 99.9% in the ambient light radiated onto the at least one second organic light detecting element from outside. That means, in other words, that less than 10% and preferably less than 1% of the ambient light is radiated onto the at least one organic light detecting layer of the at least one second organic light detecting element. In particular, the non-transparent layers can also be completely non-transmissive to ambient light and in particular that spectral component of the ambient light which corresponds to the absorption spectrum of the at least one second organic light detecting element.

Furthermore, the at least one organic light emitting element and the at least one first and second organic light detecting element are all arranged on the same side of the common substrate. Particularly preferably, with regard to further optoelectronic elements, that is to say further light emitting or light detecting elements, which can be arranged on the common substrate, the at least one first and/or second organic light detecting element can be directly adjacent to the at least one organic light emitting element, that is to say that no further organic light emitting or light detecting elements are present in a lateral direction between the at least one first and/or second organic light detecting element and the at least one organic light emitting element.

In accordance with a further embodiment, the at least one organic light emitting element is designed to emit light on an emission side of the organic optoelectronic component. An emission side, which denotes that side or those sides on which the organic optoelectronic component emits light, can be formed, for example, by the side on which, as viewed from the at least one organic light emitting layer of the at least one organic light emitting element, the common substrate is arranged. In this case, in which the common substrate is preferably embodied as transparent, the at least one organic light emitting element and also the organic optoelectronic component can be designated as a so-called bottom emitter. Furthermore, it is also possible for an emission side, as viewed from the at least one organic light emitting layer, to be arranged on the opposite side of the organic optoelectronic component relative to the common substrate. In this case, the at least one organic light emitting element and also the organic optoelectronic component can be embodied as a so-called top emitter. If the organic optoelectronic component is embodied simultaneously as a bottom emitter and as a top emitter, it can preferably be embodied as a transparent organic optoelectronic component having two emission sides.

In accordance with a further embodiment, the at least one first and/or second organic light detecting element is embodied and usable as organic photodiode. The organic photodiode can comprise in particular an organic functional layer stack between two electrodes, wherein the organic functional layer stack has as organic light detecting layer of the first and/or second organic light detecting element at least one pn junction for generating charge carriers. By way of example, the organic photodiode, with regard to the electrodes and the organic functional layer stack, can have the same construction as the at least one organic light emitting element and can be operated inversely with respect to the at least one organic light emitting element, that is to say with opposite electrical polarity, as a result of which it may be possible that the manufacture of the organic optoelectronic component causes no or hardly any additional costs in comparison with an exclusively light emitting component. As an alternative thereto, the organic photodiode, in comparison with the organic light emitting element, can comprise other materials and/or other layer constructions with regard to the electrodes and/or the organic functional layer stack, as a result of which, although an additional outlay may be necessary during manufacture, the sensitivity of the at least one organic light detecting element can also be adapted in a targeted manner.

In accordance with a further embodiment, the at least one first and/or second organic light detecting element is embodied and usable as organic photoconductor comprising an organic photoconductive material as organic light detecting layer, which material generates electrical charges upon irradiation by light. Organic photoconductive materials can be embodied, for example, in one layer on an electrically conductive layer, for example, an electrode. Furthermore, organic photoconductive materials can be embodied, for example, in at least two layers comprising at least one organic layer which generates charge carriers and an organic layer which transports charge carriers. Furthermore, an organic light detecting element embodied as an organic photoconductor can have the same construction as the at least one organic light emitting element.

Depending on the materials and construction of the at least one first and/or second organic light detecting element, the latter can also be constructed simultaneously as photoconductor and photodiode. Such an organic light detecting element can be usable as photodiode with an electrical bias voltage and as photoconductor without an electrical bias voltage.

Furthermore, depending on the materials and construction used, the electrical resistance of the at least one first and/or second organic light detecting element can also be measured, such that the at least one first and/or second organic light detecting element can be embodied as usable as organic photoresistor.

In particular, it may be advantageous, as described above, if the at least one organic light detecting element and the at least one organic light emitting element have an identical construction. Furthermore, it may also be possible for the organic light detecting element to comprise only n- or p-conducting layers or an optoelectronic layer and for these to be identical to the corresponding layers of the organic light emitting element.

The at least one organic light emitting element, the at least one first organic light detecting element and the at least one second light detecting element, with regard to their respective electrodes and organic functional layers, are preferably embodied in a manner respectively electrically isolated from one another on the substrate. In other words, the at least one first organic light detecting element and the at least one second organic light detecting element in each case cover an area region on the common substrate which is spatially separated from the area regions covered by the at least one organic light emitting element and the respective other organic light detecting element on the common substrate. As an alternative thereto, depending on the electrical driving of the organic light emitting element and of the organic light detecting element, it may also be possible for these to have a common electrode.

In accordance with a further embodiment, the at least one first and/or second organic light detecting element, with regard to its area occupation on the common substrate, is embodied as smaller than the at least one organic light emitting element. In particular, the at least one first and/or second organic light detecting element can cover on the common substrate an area which is less than or equal to ten percent or less than or equal to five percent or less than or equal to one percent of the area covered by the at least one organic light emitting element on the common substrate. In other words, the majority of the common substrate can be covered with the at least one organic light emitting element or, if appropriate, with a plurality of organic light emitting elements, while the at least one first organic light detecting element and the at least one second organic light detecting element or, if appropriate, pluralities of first and/or second organic light detecting elements occupy only a small area region, such that the organic optoelectronic component has during operation a luminous area which can substantially correspond to the total area of the common substrate.

Furthermore, the at least one first organic light detecting element can be designed to detect ambient light through the common substrate. In this case, the common substrate is particularly preferably embodied as transparent.

In accordance with a further embodiment, the common substrate is embodied as transparent and comprises glass and/or a transparent plastic or is composed thereof. By way of example, the transparent common substrate can be embodied in the form of a glass plate or glass layer or else in the form of a plastic plate, plastic layer or plastic film or else in the form of a glass-plastic laminate comprising at least one glass layer and at least one plastic layer.

If the at least one first organic light detecting element has an electrode between the at least one organic light detecting layer and the common substrate, then said electrode, in the case of ambient light detection through the substrate, is likewise embodied as transparent or has at least one light-transmissive region. This can also mean that the electrode is embodied as a ring contact, for example. Here and hereinafter, "ring contact" denotes any form of an electrode which has an opening enclosed completely or only partly by electrode material in a lateral direction. In particular, a U-shaped electrode, for example, can also come under the term ring contact.

In accordance with at least one further embodiment, the at least one first organic light detecting element is designed to detect ambient light which is radiated onto the organic optoelectronic component from the opposite side of the organic optoelectronic component relative to the substrate. In this case, the common substrate, depending on the emission direction of the organic light emitting element, can be embodied as transparent, non-transparent at least in the region of the first organic light detecting element or else completely non-transparent. If the at least one first organic light detecting element has an electrode on that side of the organic light detecting layer which faces away from the substrate, then said electrode is preferably embodied as transparent or as a ring contact. If the organic optoelectronic component has an encapsulation and/or a cover on the side facing away from the common substrate at least in the region of the first organic light detecting element, then said encapsulation and/or said cover are/is likewise embodied as transparent in this case.

In accordance with a further embodiment, the at least one first organic light detecting element is designed to detect ambient light which is radiated onto the organic optoelectronic component on a different side than an emission side of the organic optoelectronic component, such that an emission side of the organic optoelectronic component and a detection side of the at least one first organic light detecting element are different. If the organic optoelectronic component emits, for example, in the direction facing away from the common substrate, that is to say if the organic optoelectronic component has a top emitter configuration, this means that the at least one first organic light detecting element can detect ambient light through the common substrate. By contrast, if the organic optoelectronic component is embodied as a bottom emitter, this means that the at least one first organic light detecting element is designed to detect ambient light from the opposite side of the organic optoelectronic component relative to the substrate.

In accordance with a further embodiment, the at least one first organic light detecting element is designed to detect ambient light which is radiated onto the organic optoelectronic component on the emission side. In other words, a detection side of the at least one first organic light detecting element in this case corresponds to an emission side of the at least one organic light emitting element.

In accordance with a further embodiment, the organic optoelectronic component is designed in such a way that part of the light generated in the at least one organic light emitting element during operation is guided internally in the organic optoelectronic component to the at least one second organic light detecting element and in particular to the at least one organic light detecting layer thereof. Such internal light guiding from the at least one organic light emitting element to the at least one second organic light detecting element can be carried out, for example, by means of waveguiding effects and/or by scattering effects within the organic optoelectronic component. Internal light guiding can, for example, also be influenced by an internal scattering layer.

By way of example, the common substrate can form an optical waveguide which guides light from the at least one organic light emitting element internally in the organic optoelectronic component to the at least one second organic light detecting element. In this case, the common substrate is particularly preferably embodied as transparent.

If the at least one second organic light detecting element has an electrode between the at least one organic light detecting layer and the common substrate, then said electrode, in the case of light guiding through the substrate, is likewise embodied as transparent or has at least one light-transmissive region. This can also mean that the electrode is embodied as a ring contact, for example, or is formed by a transparent material.

As an alternative or in addition to the common substrate as internal optical waveguide, other layers of the organic optoelectronic component can also serve as optical waveguide between the organic light emitting element and the second organic light detecting element. By way of example, an encapsulation and/or a cover arranged above the organic layers, as viewed from the common substrate, can bring about internal light guiding from the organic light emitting element to the second organic light detecting element. A layer or an element of the organic optoelectronic component which serves as internal optical waveguide is particularly preferably embodied as transparent. Light guiding effects can in particular also be brought about by means of suitable differences in refractive index between individual layers or elements of the organic optoelectronic component. By means of a suitable choice of the differences in refractive index and/or the transparency of the layers and elements of the organic optoelectronic component which are intended to contribute to light guiding, the portion of the light guided internally from the organic light emitting element to the second organic light detecting element can be settable.

In accordance with a further embodiment, the organic optoelectronic component is designed such that light generated during operation in the at least one light emitting layer of the at least one organic light emitting element is radiated internally in the organic optoelectronic component directly onto the at least one organic light detecting layer of the at least one second organic light detecting element. That can mean, in particular, that no layers or elements which shade the at least one organic light detecting layer completely from the organic light emitting layer are present between the at least one organic light emitting layer and the at least one organic light detecting layer of the at least one second organic light detecting element.

In accordance with at least one embodiment, a method for operating the organic optoelectronic component comprises an electronic component, for example, a regulatable current and/or voltage source. The electronic component measures the light which is detected by the at least one first light detecting element and which comprises ambient light, and the light which is detected by the at least one second organic light detecting element and which comprises light guided internally in the optoelectronic component from the at least one light emitting element to the at least one light detecting element, and regulates the at least one organic light emitting element depending on the measurements. The fact that the electronic component measures the light respectively detected by the at least one first and second organic light detecting element means, in particular, that the electronic component measures the respective electronically measurable signal of the at least one first and second organic light detecting element.

By way of example, the electronic component, that is to say, for example, a regulatable current and/or voltage source, can be at least partly integrated into the organic optoelectronic component. In other words, the regulatable current and/or voltage source can be formed by an electronic component which is embodied as a hybrid or monolithic electronic circuit which can be integrated in the common substrate, for example, or which can be embodied in the form of additional functional layers on the common substrate. By way of example, for this purpose, the common substrate can comprise at least partly an integrated circuit on the basis of a semiconductor material, for example, silicon and/or printed electronics. As an alternative thereto, it may also be possible for the electronic component, that is to say, for example, the regulatable current and/or voltage source, to be embodied as an external electronic component which is interconnected with the organic optoelectronic component by means of suitable electrical connections such as, for instance, conductor tracks and/or wire connections.

Furthermore, it may also be possible for the at least one organic light emitting element, the at least one first organic light detecting element and the at least one second organic light detecting element to be interconnected separately from one another. For this purpose, the at least one organic light emitting element can be connected to an electronic component in the form of a current and/or voltage source, while the organic light detecting elements are connected in each case to an electronic component in the form of a current and/or voltage and/or resistance measuring instrument.

The features and embodiments described above and below apply equally to the organic optoelectronic component and the method for operating the organic optoelectronic component.

As a result of the monolithic integration of the at least one first organic light detecting element and the at least one second light detecting element, which elements can have, for example, the same layer construction as the at least one organic light emitting element, on a preferably in each case small, separated area region of the common substrate, in addition to the at least one organic light emitting element sensor elements can be integrated with low complexity in the organic optoelectronic component described here, said sensor elements being provided for separate external and internal light detection. Depending on the intensity of the ambient light incident on the first organic light detecting element and of the internally guided light which is incident on the second organic light detecting element and which is part of the light generated by the organic light emitting element, in each case an electrically measurable signal such as, for instance, a photovoltage, a photocurrent or a resistance change is generated which, in terms of absolute value, turns out to be all the higher, the higher the incident light intensity. The electrically measurable signals of the organic light detecting elements can be processed further in an electronic circuit which can be formed by an external electronic component or which can form a part of the organic optoelectronic component as a monolithic element. By means of the electronic circuit, the organic light emitting element can in turn be controlled such that the luminous intensity at the location of the organic light detecting elements and the emission intensity of the organic light emitting element can be kept constant directly. The areas of the organic light detecting elements can be adapted such that in each case a sufficiently stable electrically measurable signal can be generated during operation, without an instability of the light source, that is to say of the at least one organic light emitting element, being brought about on account of unstable feedbacks.

In the case of the organic optoelectronic component described here, it may advantageously be possible to achieve an exact automatic readjustment of the emitted light intensity of the organic light emitting element without one or more external sensors, which can considerably reduce in particular the circuitry outlay in comparison with known solutions. In particular, the light emitting diode can be kept constant automatically at the light originating location by virtue of the fact that it is possible to react independently to internal changes such as ageing processes of the light source and to external changes such as changed ambient light, for instance, which is not possible in the case of purely external or internal detection. Consequently, the luminance at the light originating location can be kept constant automatically independently of ageing properties of the light source even under variable ambient conditions, wherein at the same time it is possible to react to ageing phenomena of the light source. In this case, it is possible to make use of the fact, for example, that the organic light detecting elements age significantly more slowly than the at least one organic light emitting element, since, in particular, the organic materials of the organic light detecting elements are subjected to less loading, in particular less thermal loading.

In accordance with a further embodiment, at least one of the two non-transparent layers is formed by a non-transparent covering layer. The non-transparent covering layer can comprise or be composed of, for example, a non-transparent plastic or a non-transparent metal, for example, aluminum or some other metal described further below, for example, in association with electrodes. Particularly preferably, one of the two non-transparent layers can be formed by a non-transparent covering layer arranged on a side of the common substrate facing away from the at least one organic light detecting layer of the second organic light detecting element. In this case, the non-transparent covering layer can cover the area region on which the at least one second organic light detecting element is situated on the opposite side of the substrate. Furthermore, it is also possible to arrange a non-transparent covering layer between the substrate and the at least one organic light detecting layer as a non-transparent layer.

In accordance with a further embodiment, one of the two non-transparent layers is formed by the common substrate. For this purpose, the common substrate can comprise a non-transparent material, for example, a non-transparent plastic and/or a non-transparent metal, at least in the region of the at least one second organic light detecting element. If the at least one organic light emitting element is embodied as a so-called top emitter and emits light in the direction facing away from the substrate and if the at least one first light detecting element has the side facing away from the substrate as detection side, the entire common substrate can also be embodied as non-transparent. By way of example, the common substrate can comprise or be composed of a metal layer, for example, a steel film, in regions or over the entire area.

In accordance with a further embodiment, at least one of the non-transparent layers is formed by an electrode of the at least one second organic light detecting element. Particularly preferably, an electrode embodied as a non-transparent layer can be arranged on that side of the at least one organic light detecting layer of the at least one second light detecting element which faces away from the common substrate. Alternatively or additionally, the at least one second light detecting element can also have an electrode between the at least one organic light detecting layer and the common substrate, said electrode being embodied as non-transparent layer. An electrode embodied as a non-transparent layer can comprise, in particular, a non-transparent metal, that is to say a metal having a sufficient thickness. For this purpose, all customary metals and metal compounds that can be used for electrodes, such as, for instance, the metals and metal compounds described further below, are appropriate provided that they form a non-transparent layer.

In accordance with a further embodiment, one of the two non-transparent layers is formed by at least one part of an encapsulation and/or of a cover which, as viewed from the common substrate, is arranged above the at least one organic light detecting layer of the at least one second light detecting element. For this purpose, provision can be made of an encapsulation and/or a cover, as described further below, which comprises at least one layer formed from a non-transparent material at least in the region of the at least one second organic light detecting element. Furthermore, it may also be possible for a non-transparent covering layer as described above to be applied on that side of an encapsulation and/or of a cover which faces away from the at least one organic light detecting layer of the second organic light detecting element, said cover layer forming one of the two non-transparent layers.

Furthermore, combinations of the abovementioned possibilities for the two non-transparent layers are also possible.

In accordance with a further embodiment, the organic optoelectronic component comprises a plurality of first and/or second organic light detecting elements. This means that a plurality of first and/or second organic light detecting elements are arranged on the common substrate. In particular, the plurality of the organic light detecting elements and the at least one organic light emitting element are arranged on the same side of the common substrate.

By way of example, the organic optoelectronic component can comprise a plurality of first organic light detecting elements each designed to detect ambient light. By means of a plurality of first organic light detecting elements, ambient light can be detected, for example, at different positions of the organic optoelectronic component. Furthermore, it is also possible that, with different first organic light detecting elements, ambient light can be detected from different sides of the organic optoelectronic component.

In accordance with a further embodiment, at least one of the plurality of first organic light detecting elements is designed to detect ambient light through the substrate, while at least another of the plurality of first organic light detecting elements is designed to detect ambient light from the opposite side of the organic optoelectronic component relative to the substrate. In other words, at least two first organic light detecting elements are present, which can detect ambient light from different sides of the organic optoelectronic component independently of one another. In particular, at least two of the plurality of first organic light detecting elements can have different detection sides for the detection of ambient light.

Furthermore, it may also be possible that, for example, one first organic light detecting element is provided which detects ambient light only on one side of the organic optoelectronic component, that is to say, for example, on the emission side or the opposite side relative to the emission side, and is thus embodied in a manner providing detection on one side, while a further first organic light detecting element can detect ambient light on both sides of the organic optoelectronic component and is thus embodied in a manner providing detection on both sides.

Furthermore, the organic optoelectronic component can comprise a plurality of second organic light detecting elements, each of which comprises at least one organic light detecting layer arranged between two non-transparent layers, which shade the respective at least one organic light detecting layer from ambient light. The respective non-transparent layers can be embodied identically or differently for the second organic light detecting elements. By means of a plurality of second organic light detecting elements, internally guided light can be detected, for example, at different positions of the organic optoelectronic component. As a result, it may be possible, for example, to measure the uniformity of an organic optoelectronic component embodied as a surface light source.

In accordance with a further embodiment, a plurality of organic light emitting elements are arranged on the common substrate. In particular, the plurality of the organic light emitting elements and the organic light detecting elements are all arranged on the same side of the common substrate. The organic light emitting elements of the plurality of organic light emitting elements can be regulatable, for example, separately from one another, such that the individual organic light emitting elements can be enabled to be switched on or off independently of one another, for example. Furthermore, each of at least two of the plurality of organic light emitting elements can be assigned in each case at least one first and/or second organic light detecting element, preferably one first and one second organic light detecting element, in relation to the control. As a result, it may be possible for the luminous area of the organic optoelectronic component, said luminous area being formed by the totality of the organic light emitting elements, to be subdivided into functional regions which are formed by the organic light emitting elements and which can be regulated independently of one another and can be controlled with regard to the respectively emitted light power with the aid of the organic light detecting elements.

The fact that an organic light emitting element is assigned an organic light detecting element means, in particular, that the light detecting element and the light emitting element form a functional unit with regard to the brightness regulation of the light emitting element. Furthermore, it can also mean that the organic light detecting element is closest to the assigned organic light emitting element in comparison with further organic light emitting elements.

In accordance with at least one further embodiment, the organic optoelectronic component comprises an encapsulation on the at least one organic light emitting element and/or on the at least one first and/or second organic light detecting element. The encapsulation can be formed, for example, by a so-called thin-film encapsulation comprising at least one or a plurality of thin layers applied by means of a deposition method, preferably by means of a chemical vapor deposition method and/or an atomic layer deposition method, on the organic light emitting element and/or on the first and/or on the second organic light detecting element. Alternatively or additionally, the encapsulation can, for example, also comprise a glass lid that is adhesively bonded above the at least one organic light emitting element and/or above the at least one first and/or second organic light detecting element on the common substrate. Furthermore, the encapsulation can also comprise a cavity encapsulation, that is to say a lid with a depression above the organic elements, which is applied by means of adhesive bonding, soldering, glass soldering, bonding or some other suitable method.

In accordance with a further embodiment, the at least one organic light emitting element and the organic light detecting elements are encapsulated with a common encapsulation. In other words, this means that an encapsulation is applied on the organic light emitting element and the organic light detecting elements, which encapsulation extends continuously at least over all three elements. Furthermore, between the at least one organic light emitting element and the at least one first and/or second organic light detecting element, it is possible to arrange an electrical insulator layer directly on the substrate, said electrical insulator layer being covered by the common encapsulation. The electrical insulator layer directly on the substrate can be provided in particular for electrically insulating the organic light emitting element electrically from the first and/or second organic light detecting element and/or for preventing direct radiation of light from the at least one organic light emitting element to the at least one first and/or second organic light detecting element, such that in this case light from the organic light emitting element to the first and/or second organic light detecting element, if present, is achieved principally or else exclusively, for example, by internal light guiding through the common substrate and/or through some other light guiding layer.

As an alternative thereto, it may also be possible for there to be no electrical insulator layer present between the at least one organic light emitting element and the at least one first and/or second organic light detecting element. In this case, by way of example, direct radiation of light from the organic light emitting element onto the first and/or second organic light detecting element may be possible. In the case of a common encapsulation, in particular a common thin-film encapsulation, this can also mean that, between the at least one organic light emitting element and the at least one first and/or second organic light detecting element, the encapsulation is arranged directly on the substrate and is thus in direct contact with the common substrate between the two elements.

In accordance with a further embodiment, the at least one organic light emitting element is encapsulated with a first encapsulation and at least one of the first and second organic light detecting elements is encapsulated with a second encapsulation, which is applied separately from the first encapsulation. That can mean, in particular, that an interspace between the at least one organic light emitting element and the at least one first and/or second organic light detecting element is free of an encapsulation. Furthermore, an electrical insulator layer can be arranged between the at least one organic light emitting element and the at least one first and/or second organic light detecting element, said electrical insulator layer being arranged between the first and second encapsulations as viewed in a lateral direction. In other words, this can mean that the electrical insulator layer, which is preferably provided for the electrical insulation and/or optical isolation of the organic light emitting element from the first and/or second organic light detecting element, is not covered by any encapsulation and is therefore free of encapsulation material.

In accordance with a further embodiment, a coupling-out layer is arranged on the emission side of the organic optoelectronic component, said coupling-out layer being embodied as a scattering layer, for example, and facilitating light coupling-out of the light generated in the at least one organic light emitting element from the organic optoelectronic component. The coupling-out layer can be arranged, for example, on that side of the substrate which faces away from the organic light emitting element and the organic light detecting elements. Alternatively or additionally, a coupling-out layer can also be arranged as an internal scattering layer or coupling-out layer between the common substrate and the organic light emitting element. Furthermore, it may also be possible for a coupling-out layer additionally or alternatively to be arranged on the opposite side of the organic light emitting element relative to the substrate.

The organic optoelectronic component described here, in comparison with conventional organic surface emitters, can be producible without considerable additional complexity and without considerable additional costs preferably by means of an unchanged process implementation during production. As a result of the integration of the organic light detecting elements on the common substrate together with the at least one organic light emitting element, by means of a suitable regulation during operation, the radiation power of the at least one organic light emitting element, which can be embodied in particular as a surface lighting element, can be accurately adapted to internal conditions such as, for instance, a change in the luminance of the organic light emitting element and also to external changes such as, for instance, a changed ambient brightness, which can lead to an energy saving, for example, during operation. In particular, a constant illumination power is possible at the location of the at least one organic light emitting element and/or at the location of the organic light detecting elements. By means of an automated electronic circuit, which can be embodied as a monolithic electronic component or as an external electronic component with a current and/or voltage source, which can control the at least one organic light emitting element by means of the electrically measurable signals generated by the organic light detecting elements, an efficient readjustment of the illumination may be possible. The use of the first organic light detecting element and of the second organic light detecting element enables an independent detection of the ambient light and of the light generated by the organic light emitting element.

Furthermore, it may also be possible for at least two organic optoelectronic component to be operated jointly and to form light tiles, for example, wherein the at least one organic light emitting element of one organic optoelectronic component is controlled or regulated by a suitable electronic by an organic light detecting element of another organic optoelectronic component. Furthermore, it is also conceivable, with at least one organic light detecting element of the organic optoelectronic component, to control or to regulate an organic light emitting component which itself does not comprise an organic light detecting element.

BRIEF DESCRIPTION OF THE DRAWINGS

Further advantages, advantageous embodiments and developments will become apparent from the exemplary embodiments described below in association with the figures.

In the figures:

FIGS. 10A to 15E show schematic illustrations of organic optoelectronic components in accordance with further exemplary embodiments.

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with an exaggerated size in order to enable better illustration and/or in order to afford a better understanding.

DETAILED DESCRIPTION OF ILLUSTRATIVE EMBODIMENTS

Figure 1:
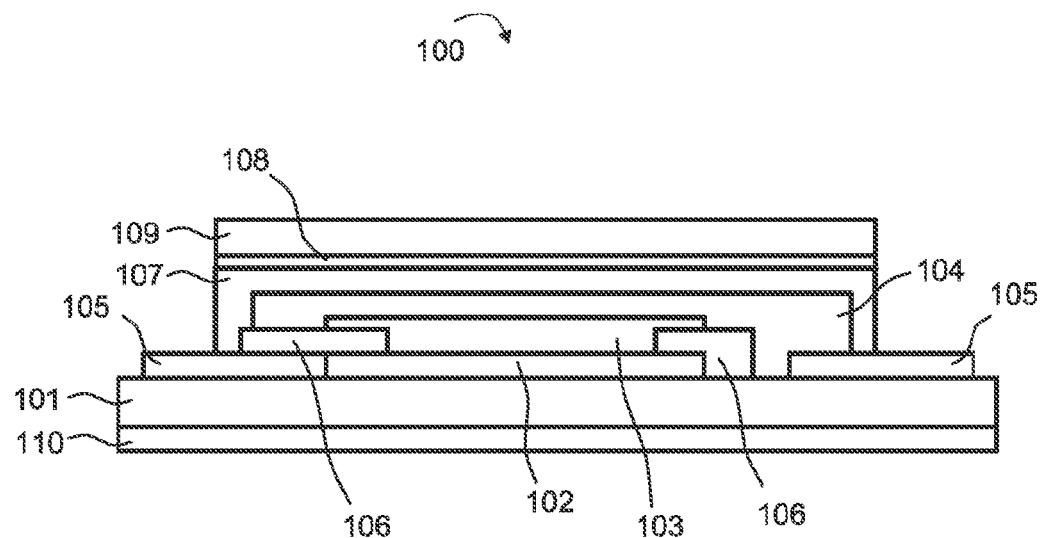
FIG. 1 shows a schematic illustration of an organic light emitting element in accordance with one exemplary embodiment.

FIG. 1 shows, in accordance with one exemplary embodiment, the basic construction of an organic light emitting element 100 embodied as an organic light emitting diode (OLED).

The organic light emitting element 100, which may also be designated as OLED 100 hereinafter, comprises a substrate 101, on which an organic functional layer stack 103 having at least one organic light emitting layer is arranged between electrodes 102 and 104. At least one of the electrodes 102, 104 is embodied as transparent, such that light generated in the organic functional layer stack 103 during the operation of the OLED 100 can be radiated through the at least one transparent electrode.

In the OLED 100 shown in FIG. 1, the substrate 101 is embodied as transparent, for example, in the form of a glass plate or glass layer. As an alternative thereto, the substrate 101 can, for example, also comprise a transparent plastic or a glass-plastic laminate.

The electrode 102 applied on the substrate 101 is likewise embodied as transparent and comprises a transparent conductive oxide, for example. Transparent conductive oxides (TCOs) are transparent conductive materials, generally metal oxides, such as, for example, zinc oxide, tin oxide, cadmium oxide, titanium oxide, indium oxide and indium tin oxide (ITO). Alongside binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped. Furthermore, a transparent electrode can, for example, also comprise a transparent metal, metallic network structures or conductive networks, for example, comprising or composed of silver, and/or graphene or carbon-containing layers or a combination of the transparent materials mentioned.

In the exemplary embodiment shown, the further electrode 104 on the organic functional layer stack 103 is embodied as reflective and comprises a metal, which can be selected from aluminum, barium, indium, silver, gold, magnesium, calcium and lithium, and compounds, combinations and alloys therewith. In particular, the electrode 104 can comprise Ag, Al or alloys or layer stacks comprising these, for example, Ag/Mg, Ag/Ca, Mg/Al or Mo/Al/Mo or Cr/Al/

Cr. Alternatively or additionally, the electrode 104 can also comprise an abovementioned TCO material or a layer stack comprising at least one TCO and at least one metal.

In the exemplary embodiment shown, the bottom electrode 102 is embodied as an anode, while the top electrode 104 is embodied as a cathode. With an appropriate choice of materials, however, a construction reversed with respect to the polarity is also possible.

The electrodes 102, 104 are preferably embodied in large-area and continuous fashion, such that the organic light emitting element 100 is shaped as a luminous source, in particular as a surface light source. In this case, "large-area" can mean that the organic light emitting element 100 has an area of greater than or equal to a few square millimeters, preferably greater than or equal to one square centimeter and particularly preferably greater than or equal to one square decimeter. As an alternative thereto, it may also be possible that at least one of the electrodes 102, 104 of the organic light emitting element 100 between which the organic functional layer stack 103 is situated is embodied in a structured fashion, as a result of which a spatially and/or temporally structured and/or variable luminous impression, for example, for structured lighting or for a display device, can be made possible by means of the organic light emitting element 100.

For electrically contacting the electrodes 102 and 104, as is shown in FIG. 1, electrode connection pieces 105 can also be provided, which extend through below the encapsulation 107 (described further below) from the electrodes 102, 104 toward the outside. The electrode connection pieces 105 embodied as electrical contact feeds can be embodied as transparent or non-transparent depending on the emission direction of the OLED 100 and can comprise or be composed of a TCO and/or a metal, for example. By way of example, the electrode connection pieces 105 can be formed by a metal layer or a metal layer stack, for example, Mo/Al/Mo, Cr/Al/Cr or Al.

The organic functional layer stack 103 can comprise, in addition to the at least one organic light emitting layer, further organic layers, for example, one or more selected from a hole injection layer, a hole transport layer, an electron blocking layer, a hole blocking layer, an electron transport layer, an electron injection layer and a charge generation layer (CGL), which are suitable for conducting holes or electrons to the organic light emitting layer or for blocking the respective transport. The layers of the organic functional layer stack 103 can comprise organic polymers, organic oligomers, organic monomers, organic small, non-polymeric molecules ("small molecules"), or combinations thereof. In particular, it may be advantageous if the organic functional layer stack 103 comprises a functional layer embodied as a hole transport layer in order to enable an effective injection of holes into the organic light emitting layer. By way of example, tertiary amines, carbazole derivatives, conductive polyaniline or polyethylene dioxythiophene may prove to be advantageous as materials for a hole transport layer. Suitable materials for the light emitting layer include electroluminescent materials which exhibit radiation emission on account of fluorescence or phosphorescence, for example, polyfluorene, polythiophene or polyphenylene or derivatives, compounds, mixtures or copolymers thereof.

Furthermore, as shown in FIG. 1, insulator layers 106 can be present, for example, comprising or composed of polyimide, which insulator layers can electrically insulate the electrodes 102, 104 from one another, for example. Depending on the configuration of the individual layers of the OLED 100, insulator layers 106 moreover need not be absolutely necessary and may be absent, for instance in the case of corresponding mask processes for applying the layers.

An encapsulation 107 for protecting the organic functional layer stack 103 and the electrodes 102, 104 is arranged above the organic functional layer stack 103 and the electrodes 102, 104. In this case, the encapsulation 107 is particularly preferably embodied as a thin-film encapsulation.

In the present case, an encapsulation embodied as a thin-film encapsulation is understood to mean a device suitable for forming a barrier with respect to atmospheric substances, in particular with respect to moisture and oxygen and/or with respect to further damaging substances such as, for instance, corrosive gases, for example, hydrogen sulfide. In other words, the thin-film encapsulation is embodied in such a way that at most very small portions of atmospheric substances can penetrate through it. This barrier effect in the case of the thin-film encapsulation is substantially produced by barrier layers and/or passivation layers which are embodied as thin layers and which are part of the encapsulation. The layers of the encapsulation generally have a thickness of less than or equal to a few 100 nm.

In particular, the thin-film encapsulation can comprise or consist of thin layers which are responsible for the barrier effect of the encapsulation. The thin layers can be applied, for example, by means of an atomic layer deposition (ALD) method or molecular layer deposition (MLD) method. Suitable materials for the layers of the encapsulation arrangement are, for example, aluminum oxide, zinc oxide, zirconium oxide, titanium oxide, hafnium oxide, lanthanum oxide, tantalum oxide. The encapsulation preferably comprises a layer sequence having a plurality of the thin layers, each having a thickness of between one atomic layer and a few 100 nm.

As an alternative or in addition to thin layers produced by means of ALD or MLD, the encapsulation can comprise at least one or a plurality of further layers, that is to say in particular barrier layers and/or passivation layers, which are deposited by a thermal vapor deposition or by means of a plasma-assisted process, for instance sputtering, chemical vapor deposition (CVD) or plasma-enhanced chemical vapor deposition (PECVD). Suitable materials therefor may be the abovementioned materials and silicon nitride, silicon oxide, silicon oxynitride, indium tin oxide, indium zinc oxide, aluminum-doped zinc oxide, aluminum oxide, and mixtures and alloys of the materials mentioned. The one or the plurality of further layers can have, for example, in each case a thickness of between 1 nm and 5 µm and preferably between 1 nm and 400 nm, inclusive of the limits.

As an alternative or in addition to a thin-film encapsulation, the encapsulation 107 can also comprise a glass lid which, for example, in the form of a glass substrate having a cavity, is adhesively bonded on the substrate 101 by means of an adhesive layer. Furthermore, a moisture-absorbing substance (getter), for example, composed of zeolite, can be adhesively bonded into the cavity in order to bind moisture, oxygen or other damaging gases which can penetrate through the adhesive. Furthermore, the adhesive layer for fixing the lid on the substrate may also itself be absorbent for damaging substances and/or adhesive layer structures may be present.

Furthermore, as shown in FIG. 1, a cover 109 adhesively bonded by means of an adhesive layer 108 can be arranged on the encapsulation 107, as viewed from the substrate 101. The cover 109, which can also be designated as "superstrate" in view of its arrangement in comparison with the substrate 101, can be formed, for example, by a glass layer or glass plate or else a plastic, a metal or a combination or a laminate of the materials mentioned and, in particular in conjunction with an encapsulation 107 embodied as a thin-film encapsulation, can serve as mechanical protection, in particular as anti-scratch protection, without the cover 109 itself having to have an encapsulating effect. Alternatively or additionally, a protective lacquer, for example, in the form of a spray lacquer, can also be applied on the encapsulation 107.

On account of the transparent substrate 101 and the transport bottom electrode 102, the OLED 100 is embodied as a so-called bottom emitter and emits light through the transparent electrode 102 and the transparent substrate 101 during operation. In order to improve the coupling out of light, as shown in FIG. 1, an optical coupling-out layer 110 can be arranged on that side of the substrate 101 which faces away from the organic functional layer stack 103, said optical coupling-out layer being embodied, for example, as a scattering layer comprising scattering particles in a transparent matrix and/or having a light-scattering surface structure. It is also possible to arrange a coupling-out layer, for example, between the substrate 101 and the bottom electrode 102 arranged on the substrate 101 or between other functional layers in the form of an internal coupling-out layer.

As an alternative to the bottom emitter configuration described, the top electrode 104 arranged in a manner facing away from the substrate 101 can also be embodied as transparent, in order that the light generated in the organic functional layer stack 103 during operation is emitted through the top electrode 104 in a direction facing away from the substrate 101. In this case, the OLED 100 is embodied as a so-called top emitter. The bottom electrode 102 arranged between the substrate 101 and the organic functional layer stack 103 can also be embodied as reflective, if light emission through the substrate 101 is not desired. Likewise, in this case, the substrate 101 can comprise a non-transparent material, for example, a non-transparent glass, a non-transparent plastic, a metal or combinations thereof. In addition to the top electrode 104, in the top emitter configuration the encapsulation 107 and, if present, also the adhesive layer 108 and the cover 109 are also embodied as transparent. Furthermore, in this case, a coupling-out layer can be arranged above the top electrode 104, for example, on the cover 109 or between the cover 109 and the encapsulation 107.

Furthermore, the OLED 100 can also be embodied simultaneously as a bottom emitter and as a top emitter and thus preferably as a transparent OLED and can have a combination of the features respectively mentioned in association with the bottom and top emitter configurations.

With regard to further features of the organic light emitting element 100, for example, with regard to the construction, the layer composition and the materials of the organic functional layer stack, of the electrodes and of the encapsulation, reference is made to International Application Publication No. WO 2010/066245 A1, which is hereby expressly incorporated by reference with regard to the construction of an organic light emitting component and also with regard to modifications and variations of the organic light emitting element shown in FIG. 1.

The exemplary embodiments shown hereinafter have in each case an organic light emitting element 100 which may be embodied in accordance with the exemplary embodiment in FIG. 1 or which may have modifications or variations with respect thereto. In particular, the features of the basic construction of the organic light emitting element 100 as shown in FIG. 1 should not be understood to be restrictive for the following exemplary embodiments.

Figure 2A:
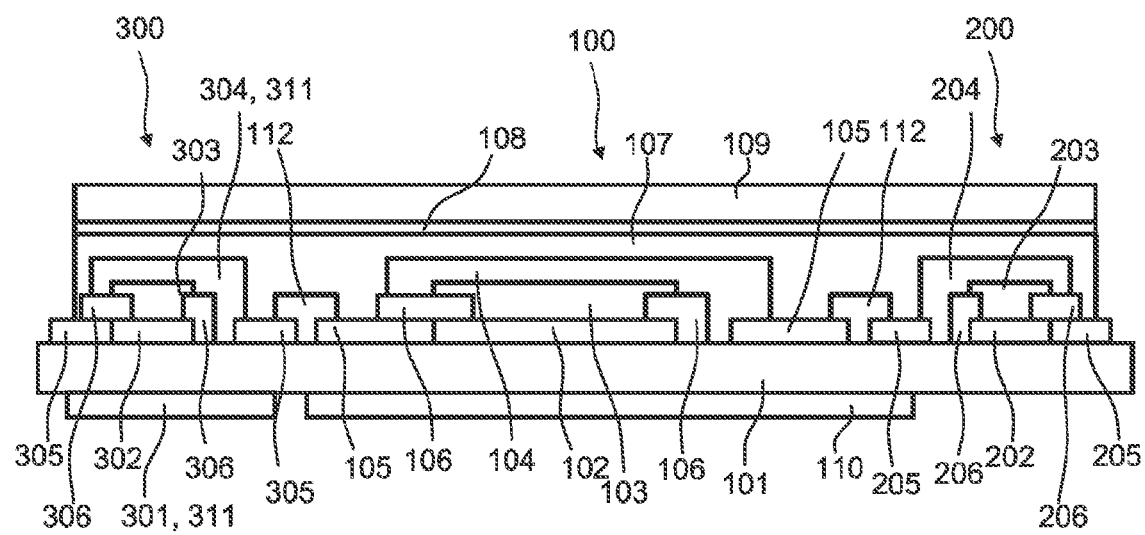
FIGS. 2A and 2B show schematic illustrations of an organic optoelectronic component and of the light relationships in the case of an organic optoelectronic component in accordance with further exemplary embodiments.

FIG. 2A shows an organic optoelectronic component in accordance with one exemplary embodiment, comprising alongside an organic light emitting element 100 a first organic light detecting element 200 and a second organic light detecting element 300. The organic light detecting elements 200, 300 are arranged together with the organic light emitting element 100 on the substrate 101, such that the substrate 101 forms a common substrate for the organic light emitting element 100 and the organic light detecting elements 200, 300. In particular, the organic light emitting element 100 and the organic light detecting elements 200, 300 are arranged on the same side of the common substrate 101 in laterally adjacent area regions. As a result, the organic light emitting element 100 and the organic light detecting elements 200, 300 are applied in a same plane and in direct contact with the substrate 101 on the latter.

In the exemplary embodiment shown, purely by way of example, both organic light detecting element 200, 300 are embodied and usable as organic photodiodes. The first organic light detecting element 200 comprises an organic functional layer stack 203 between two electrodes 202, 204, wherein the organic functional layer stack 203 has at least one organic light detecting layer. The second organic light detecting element 300 comprises an organic functional layer stack 303 between two electrodes 302, 304, wherein the organic functional layer stack 303 has at least one organic light detecting layer. In the exemplary embodiment shown, the organic light detecting layers are embodied in each case as a pn junction for generating charge carriers.

In particular, the organic light detecting elements 200, 300, in the exemplary embodiment shown, with regard to the electrodes 202, 204, 302, 304 and the organic functional layer stacks 203, 303, have the same construction as the organic light emitting element 100 with regard to the electrodes 102, 104 and the organic functional layer stack 103 and can be operated in each case inversely with respect to the organic light emitting element 100, that is to say with opposite electrical polarity. As a result, the manufacture of the organic optoelectronic component shown may cause no or only low additional costs in comparison with an exclusively light emitting component. As an alternative thereto, the first organic light detecting element 200 and/or the second organic light detecting element 300, in comparison with the organic light emitting element 100, may comprise different materials and/or different layer constructions with regard to the respective electrodes 202, 204, 302, 304 and/or the respective organic functional layer stack 203, 303.

Figure 2B:
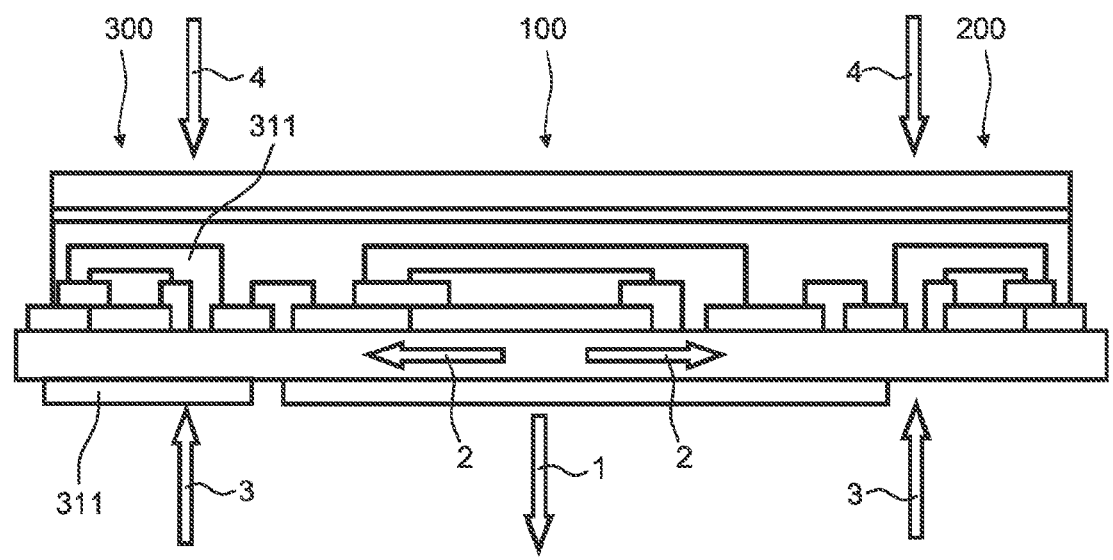

The at least one organic light detecting layer of the second organic light detecting element 300 is furthermore arranged between two non-transparent layers 311. One of the two non-transparent layers 311, which is arranged above the organic functional layer stack 303 as viewed from the common substrate 101, is formed by the top electrode 304, which comprises a non-transparent material, for example, a metal described above in connection with the electrodes 102, 104, such as aluminum, silver and/or magnesium, for instance. The other of the two non-transparent layers 311 is formed by a non-transparent covering layer 301, which, in the exemplary embodiment shown, is arranged on that side of the common substrate 101 which faces away from the organic functional layer stack 303, and comprises a non-transparent metal and/or a non-transparent plastic. The non-transparent layers 311, as explained in greater detail in association with FIG. 2B, are provided and designed for shading the at least one organic light detecting layer of the second organic light detecting element 300 from ambient light.

The organic optoelectronic component furthermore comprises an encapsulation 107, which is embodied as a thin-film encapsulation and which forms a common encapsulation for the organic light emitting element 100 and the organic light detecting elements 200, 300. In other words, the encapsulation 107 extends with large area and continuously over the functional layers of the organic light emitting element 100 and of the organic light detecting elements 200, 300. A common cover 109 is fixed on the common encapsulation 107 by means of an adhesive layer 108.

Furthermore, electrode connection pieces 205, 305 are present, which serve for electrically contacting the electrodes 202, 204, 302, 304 and which can be embodied like the electrode connection pieces 105 of the organic light emitting element 100. The electrode connection pieces 105, 205, 305 extend from the elements 100, 200, 300, out of the encapsulation 107, such that the elements 100, 200, 300 can be contacted externally.

An electrical insulator layer 112 is arranged between the organic light emitting element 100 and each of the organic light detecting elements 200, 300 directly on the substrate 101, said electrical insulator layer being covered by the common encapsulation 107. The electrical insulator layer 112, which can comprise or be composed of polyimide or some other electrically insulating material, for example, serves for electrically insulating the organic light detecting elements 200, 300 from the organic light emitting element 100, such that the electrode connection pieces 105, 205, 305 of the elements 100, 200, 300 can also be arranged at a small distance from one another on the common substrate 101, without the occurrence of an electrical crosstalk between the elements 100, 200, 300.

FIG. 2B indicates the light relationships during operation for the organic optoelectronic component from FIG. 2A. In FIG. 2B and also in the subsequent Figures, the reference signs of the individual layers and parts of the organic optoelectronic component respectively shown are depicted principally only with regard to differences with respect to previously described exemplary embodiments, for the sake of clarity.

The organic light emitting element 100 in FIGS. 2A and 2B and thus the organic optoelectronic component shown, in the exemplary embodiment shown, is embodied purely by way of example as a bottom emitter and during operation emits light 1 through the common substrate and the electrode embodied as transparent that is arranged between the organic functional layer stack and the common substrate. The substrate side of the organic optoelectronic component thus forms the emission side.

Through the transparent substrate, part of the light generated by the organic light emitting element 100 is guided internally in the organic optoelectronic component to the organic light detecting elements 200, 300 on account of scattering and waveguiding effects, as indicated by the arrows having the reference signs 2. Furthermore, depending on the embodiment of the electrodes, insulator layers and other layers and elements, alternatively or additionally it may also be possible for light to be guided in other layers internally from the organic light emitting element 100 to one or both organic light detecting elements 200, 300, for example, through the common encapsulation.

If the second organic light detecting element 300, as in the exemplary embodiment in FIGS. 2A and 2B, has an electrode 302 between the at least one organic light detecting layer and the common substrate 101, then said electrode, in the case of light guiding in the substrate 101, is likewise embodied as transparent or has at least one light-transmissive region. This can also mean that the electrode 302 is embodied as a ring contact, for example. Here and hereinafter, "ring contact" denotes any form of an electrode which has an opening that is completely or else only partly enclosed by electrode material in a lateral direction. In particular, a U-shaped electrode, for example, can also come under the term ring contact.

By means of a targeted adaptation of the respective distance between the organic light emitting element 100 and each of the organic light detecting elements 200, 300 and in this case in particular with regard to an absorption in the common substrate, by means of a suitable arrangement of one or a plurality of coupling-out layers on one or both sides of the common substrate, by means of a suitable choice of materials with regard to the electrodes, the insulator layers and the encapsulation, for example, with regard to a suitable refractive index for setting the total internal reflection in the substrate or the cover, and by means of suitable substrate materials which are non-transparent at least in places, in particular, for example, in the case of an embodiment of the organic light emitting element 100 as a top emitter, the proportion of the light 2 guided internally from the organic light emitting element 100 in each case to the organic light detecting element 200 and to the organic light detecting element 300, can be set in a targeted manner. A complete suppression or at least a greatest possible reduction of the internally guided light 2 to the first organic light detecting element 200 may be desirable and advantageous in particular if the intention is for only ambient light, that is to say external light, to be detected by the second organic light detecting element 200.

As is furthermore shown in FIG. 2B, ambient light 3, 4 can also be radiated onto the organic optoelectronic component. The ambient light can be radiated onto the organic optoelectronic component on the substrate side, indicated by the reference signs 3, and/or on the side of the cover, indicated by the reference signs 4, depending on the arrangement and embodiment of the organic optoelectronic component. The ambient light 3, 4 can be, for example, light from other natural or artificial light sources or else light 1 from the organic optoelectronic component which is reflected back onto the organic optoelectronic component by external reflection from outside.

The first organic light detecting element 200 is designed to detect ambient light 3, 4 from the substrate side and/or from the side of the cover and for this purpose, as explained in greater detail in subsequent exemplary embodiments, is embodied as transparent on at least one of the two side, such that ambient light 3 and/or ambient light 4 can be radiated onto the at least one organic light detecting layer of the first organic light detecting element 200.

By means of the non-transparent layers 311 described in association with FIG. 2A, which, in the exemplary embodiment shown, are formed by the non-transparent covering layer 301 on the substrate side and by the top electrode 304 on the opposite side of the at least one organic light detecting layer of the second organic light detecting element 300 relative to the substrate, it is possible to achieve a shading from ambient light 3, 4 in the region of the second organic light detecting element 300 and thus a shading of the corresponding organic light detecting layer. In particular, the non-transparent layers 311 can be non-transmissive at least to the extent of 90%, and particularly preferably at least to the extent of 99% or even greater than or equal to 99.9%, for that part of the ambient light which corresponds to the absorption spectrum of the at least one organic light detecting layer of the second organic light detecting element 300. As a result, the influence of the ambient light 3, 4 on the electrically measurable signal of the second organic light detecting element 300, that is to say, for example, a photovoltage in the case of an organic photodiode as second organic light detecting element, can be reduced or even completely prevented.

Instead of the non-transparent covering layer 301 in the exemplary embodiment in FIGS. 2A and 2B, as non-transparent layer 311 on the substrate side, for example, it is also possible to use a non-transparent electrode 302 or a substrate 101 which is non-transparent in the region of the second organic light detecting element 300. If the organic light emitting element 100 is embodied as a top emitter, the entire common substrate 101 can also be embodied as non-transparent. For this purpose, the substrate 101 can, for example, be formed by a metal film or comprise a metal film. In this case, the internal light guiding of the light 2 is then effected through layers different than the substrate 101, for example, the encapsulation 107 and/or the covering layer 109. Instead of a non-transparent electrode 304 as second non-transparent layer, it is also possible to provide an additional non-transparent covering layer on the covering layer 109, on the encapsulation 107 or between the electrode 304 and the encapsulation 107. Furthermore, the encapsulation 107 and/or the cover 109 can also be embodied as non-transparent layer 311 at least in the region of the organic light detecting element 300.

The organic optoelectronic component in accordance with the exemplary embodiment in FIGS. 2A and 2B and also in accordance with the subsequent exemplary embodiments is therefore designed to detect, by means of the first organic light detecting element 200 and the second organic light detecting element 300, independently of one another, internally guided light 2 generated by the organic light emitting element 100 and ambient light 3, 4.

By way of example, the organic optoelectronic component is embodied in such a way that the at least one first organic light detecting element 200 detects only or for the most part only ambient light 3, 4. This can be achieved, for example, by means of suitable precautions such as non-transparent materials in and/or on the substrate 101 between the organic light emitting element 100 and the first organic light detecting element 200. Furthermore, in order to reduce the internally guided light 2 measured by the first organic light detecting element 200, the first organic light detecting element 200 can, for example, be at a lateral distance from the organic light emitting element 100 that is greater than a lateral distance between the second organic light detecting element and the organic light emitting element, as is also shown further below in FIG. 7. As a result, the measurable signal generated by the first organic light detecting element 200 can provide direct conclusions about changes in the ambient light 3, 4. Furthermore, the first organic light detecting element 200 can also measure internally guided light 2 generated by the organic light emitting element 100, in addition to the ambient light 3, 4. If the ratio of the internally guided light 2 measured by the first organic light detecting element 200 to the internally guided light 2 measured by the second organic light detecting element 300 is known, which can be determined, for example, in test measurements or by simulations, the contribution of the ambient light 3, 4 to the signal of the first organic light detecting element 200 can in turn be extracted from the signals of both organic light detecting elements 200, 300.

Furthermore, the light guided in each case internally to the organic light detecting elements 200, 300 can also be influenced by an internal coupling-out layer between the organic light emitting element 100 and at least one of the organic light detecting elements 200, 300.

The following exemplary embodiments show variations and modifications of the organic optoelectronic component in accordance with the exemplary embodiment in FIGS. 2A and 2B which exhibit, inter alia, variation possibilities in terms of construction and for light detection. By way of example, it is possible to vary the respective type of the organic light detecting elements with regard to the construction and the functioning and/or the electrical circuitry, the number of organic light detecting elements, the position of one or more organic light detecting elements in relation to the luminous area of the organic light emitting element, the respective detection area of the organic light detecting elements, for example, in relation to an adaptation to the organic light emitting element in terms of geometry, stack and/or circuitry, the respective distance between the organic light detecting elements and the organic light emitting element, the arrangement and number of one or more coupling-out layers and/or the waveguide properties in the substrate or the rest of the layer structure and thus the signal transmission between the organic light emitting element and the organic light detecting elements.

Figure 3:
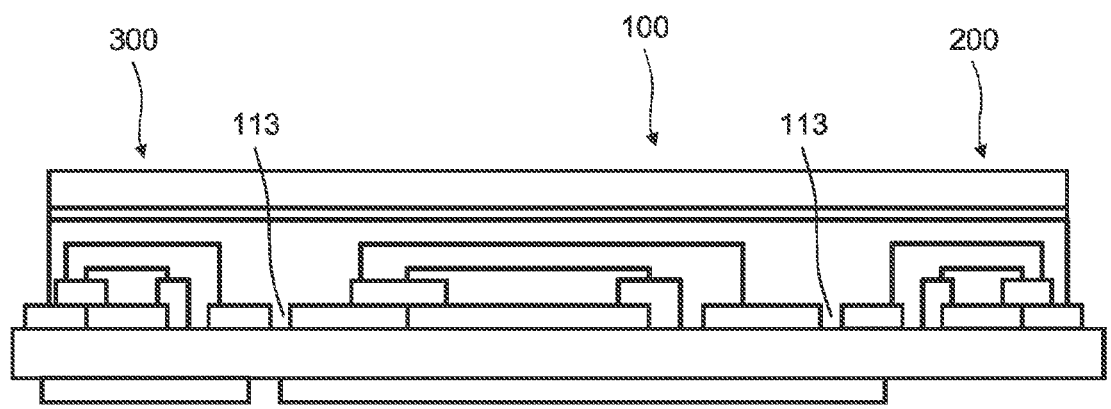
FIGS. 3 to 9B show schematic illustrations of organic optoelectronic components in accordance with further exemplary embodiments.

FIG. 3 shows an organic optoelectronic component having, in comparison with the exemplary embodiment in FIGS. 2A and 2B, between the organic light emitting element 100 and the organic light detecting elements 200, 300 in each case an interspace 113 instead of an electrical insulator layer 112. In the exemplary embodiment shown, the common encapsulation extends between the elements 100 and 200, and also 100 and 300, as far as the common substrate. As a result, by way of example, internally in the organic optoelectronic component, light can be guided through the encapsulation from the organic light emitting element 100 to the organic light detecting elements 200, 300. As an alternative thereto, it is also possible to provide an insulator layer 112 only between the organic light emitting element 100 and one of the organic light detecting elements 200, 300, in order that the latter is, for example, also optically isolated from the organic light emitting element 100 with regard to direct irradiation by internally guided light.

Figure 4A:
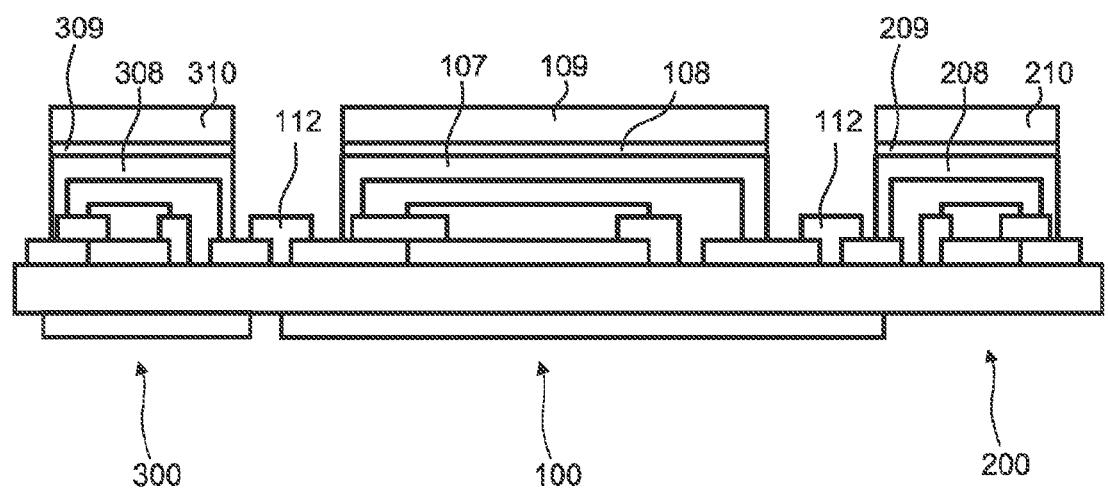

FIG. 4A shows one exemplary embodiment of an organic optoelectronic component which, purely by way of example, in comparison with the exemplary embodiment in accordance with FIGS. 2A and 2B, does not have a common encapsulation with a common cover. In particular, the organic light emitting element 100 has a first encapsulation 107, while the first organic light detecting element 200 and the second organic light detecting element 300 in each case have a dedicated second encapsulation 208, 308, which are applied separately from the first encapsulation 107, such that the organic light emitting element 100 and the organic light detecting elements 200, 300 are encapsulated independently of one another. In each case, as shown in FIG. 4A, an electrical insulator layer 112 not covered by any of the encapsulations 107, 208, 308 can be provided between the organic light emitting element 100 and the organic light detecting elements 200, 300. As an alternative thereto, it is also possible to provide an interspace without an insulator layer 112 between the encapsulations 107, 208, 309.

The encapsulations 107, 208, 308 can be embodied identically or differently and can be adapted to the respective requirements of the organic light emitting element 100 and of the organic light detecting elements 200, 300 in particular in terms of the choice of materials, the optical properties and the encapsulation properties. In each case a cover 109, 210, 310 is applied on the encapsulations 107, 208, 308 by means of a respective adhesive layer 108, 209, 309, which cover can be embodied, for example, like the common cover 109 in accordance with the previous exemplary embodiments. However, it may also be possible that, for example, the encapsulation 308 and/or the cover 310 of the second organic light detecting element 300 are/is embodied as non-transparent layer, while the encapsulation 107 and the cover 109 can be embodied as transparent or non-transparent depending on the desired properties of the organic light emitting element 100 independently of the second organic light detecting element 300.

Figure 4B:
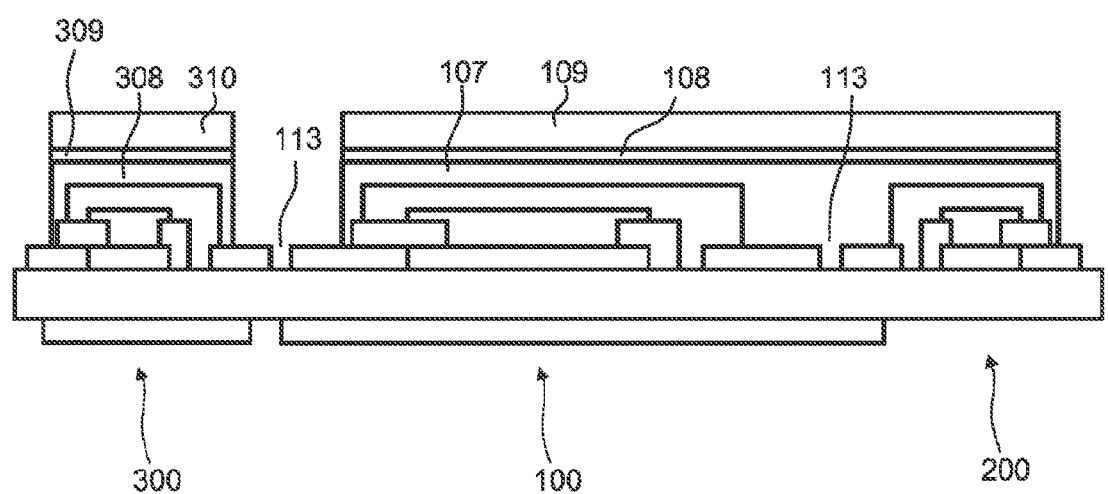

FIG. 4B shows one exemplary embodiment of an organic optoelectronic component which, in comparison with the previous exemplary embodiment, does not have an electrical insulator layer 112 between the organic light emitting element 100 and the organic light detecting elements 200, 300, but rather in each case an interspace 113. Furthermore, the organic light emitting element 100 and the first organic light detecting element 200 are arranged below a common first encapsulation 107, while the second organic light detecting element 300 has a second encapsulation 308 separate therefrom.

By means of separate encapsulations 107, 208, 308 in accordance with the exemplary embodiments in FIGS. 4A and 4B for the organic light emitting element 100 and at least one of the organic light detecting elements 200, 300, it is possible, for example, to influence the light which is internally guided, for example, directly radiated, from the organic light emitting element 100 in each case onto the organic light detecting elements 200, 300 by scattering and/or waveguiding. By virtue of the separate encapsulations 107, 208, 308, furthermore, changed real and/or imaginary refractive index portions are present at the waveguide interface, that is to say the substrate, for example, and can influence the internal light guiding to the organic light detecting elements 200, 300. By way of example, total internal reflection in the waveguide formed by the substrate, the bottom electrodes and/or the coupling-out layer can be utilized for the case where the real refractive index portion of the waveguide is less than that of the surroundings, that is to say air, for example.

Furthermore, the elements 100, 200, 300 can be electrically contacted in the interspace between the encapsulations 107, 208, 308.

The organic optoelectronic components described in association with the following exemplary embodiments can also comprise at least partly separate encapsulations 107, 208 and/or 308 for the elements 100, 200, 300 instead of the continuous common encapsulation 107 shown there.

Figure 5A:
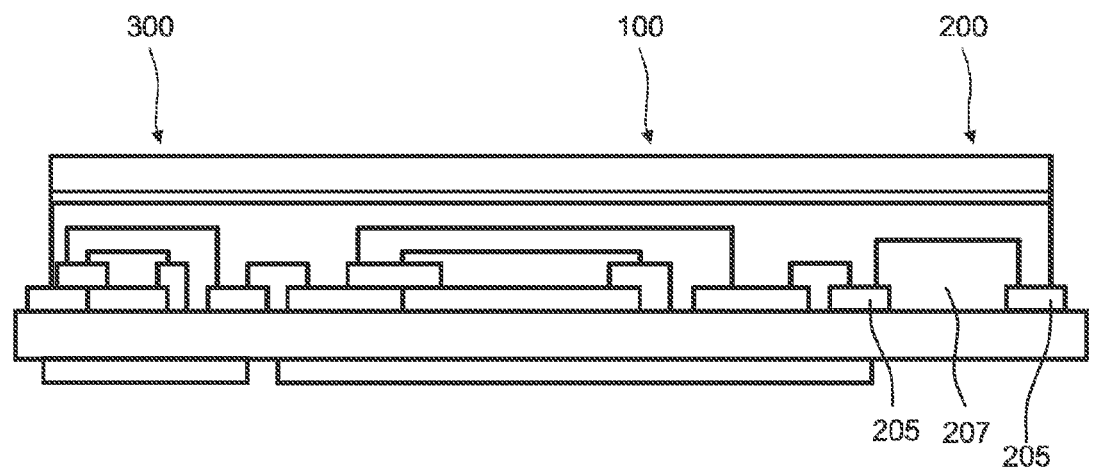
Figure 5B:
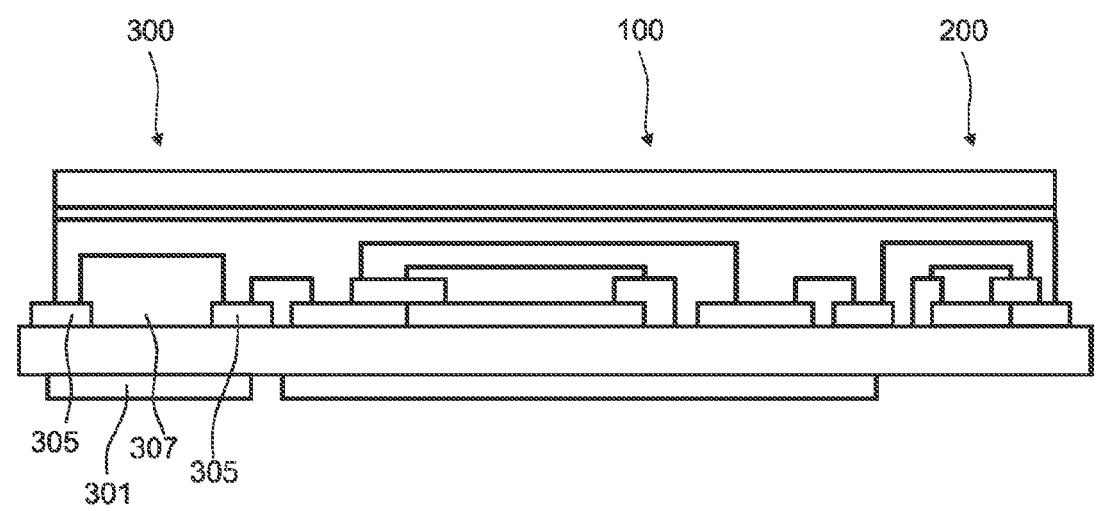

FIGS. 5A and 5B show further exemplary embodiments of organic optoelectronic components comprising, in comparison with the previous exemplary embodiments, instead of a first or second organic light detecting component 200, 300 embodied as organic photodiode, a first organic light detecting element 200 and respectively a second organic light detecting element 300 embodied in each case as an organic photoconductor comprising an organic photoconductive material 207, 307 which generates electrical charges upon irradiation by light.

Photoconductive organic materials can be embodied in one layer on an electrically conductive layer, for example, as in the exemplary embodiment shown, for example, on an electrode or on the electrode connection pieces 205, 305 shown in FIGS. 5A and 5B also without an additional electrode. By way of example, the organic photoconductive material 207, 307 can be based on a PVK-TNF charge transfer complex (PVK: polyvinylcarbazole, TNF: 2,4,7-trinitro-9-fluorenone). Furthermore, the organic photoconductive material 207, 307 can, for example, also be embodied in two layers in the form of an organic charge generation layer and an organic layer that transports charge carriers. Examples of organic materials that generate charge carriers include (di)azo dyes, squaraine derivatives and phthalocyanines, and examples of organic materials that conduct charge carriers include arylamines, oxadiazoles, TPD (N,N'-bis(3-methylphenyl)-N,N'-bis(phenyl)benzidine) and NPB (N,N'-bis(naphthalen-1-yl)-N,N'-bis(phenyl)benzidine). Furthermore, an organic light detecting element 200, 300 embodied as organic photoconductor can have the same construction as the organic light emitting element 100, wherein here it is possible to utilize the depletion layer properties of the at least one pn junction of the organic active layer in the functional layer stacks.

As an alternative to the exemplary embodiments shown, for example, it is also possible for both organic light detecting elements 200, 300 to be embodied as organic photoconductors.

For shading the second organic light detecting element 300 embodied as a photoconductor in accordance with the exemplary embodiment in FIG. 5B, by way of example, the non-transparent covering layer 301 shown in FIG. 5B on the substrate and, at least in the region of the second organic light detecting element 300, the encapsulation and/or the cover can be provided as non-transparent layers. Furthermore, a further non-transparent covering layer can, for example, also be provided on that side of the at least one organic light detecting layer of the second light detecting element 300 which faces away from the substrate. In order to prevent ambient light from being radiated onto the organic photoconductive material 307, alternatively or additionally non-transparent insulator layers, electrically insulated metal layers, non-transparent materials for the encapsulation and/or a non-transparent cover, for example, a non-transparent glass cover, can thus be provided. Corresponding constructions can also be chosen on one side in relation to the first organic light detecting element 200 in accordance with the exemplary embodiment in FIG. 5A, for example, if it is desired only to detect ambient light on one side.

Depending on materials and construction of the organic light detecting elements 200, 300, the latter can also be constructed simultaneously as photoconductor and photodiode. Such an organic light detecting element can be usable as a photodiode with an electrical bias voltage and as a photoconductor without an electrical bias voltage.

Furthermore, depending on materials and construction, the electrical resistance of the organic light detecting elements 200, 300 can also be measured, such that the first and/or second organic light detecting element 200, 300 can be embodied and usable as organic photoresistor. By way of example, an organic light detecting element for this purpose can comprise an organic functional layer based on pentacene.

Figure 6A:
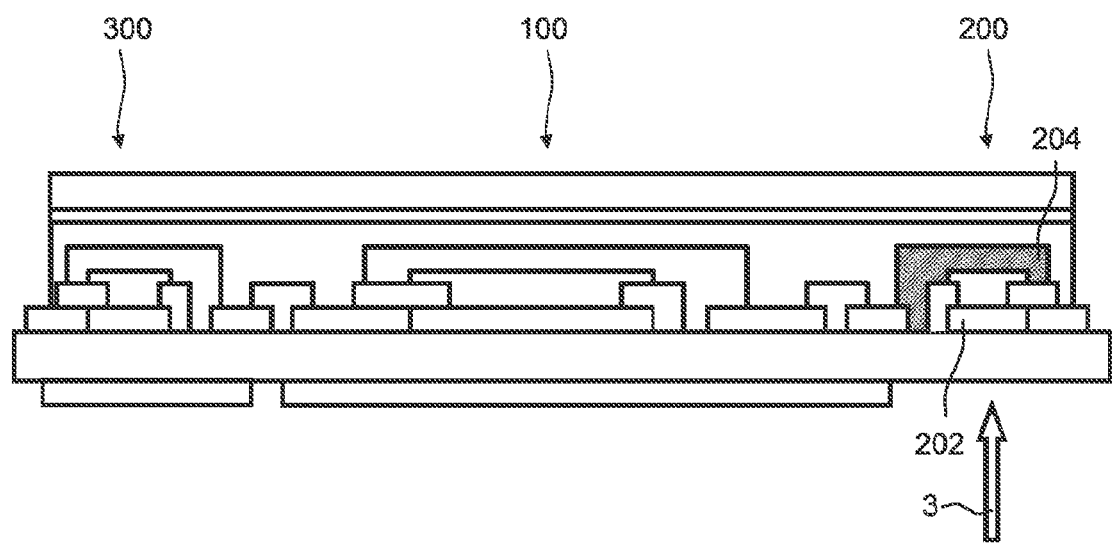
Figure 6B:
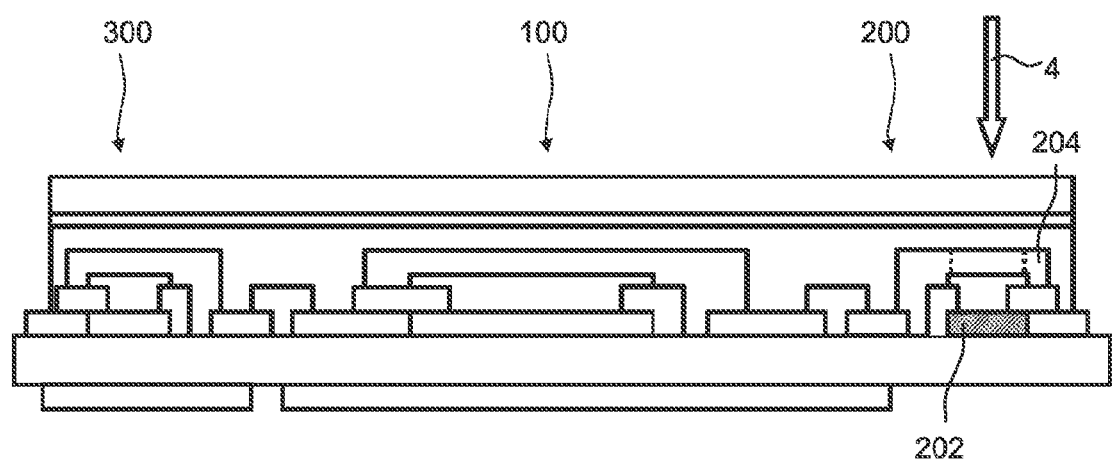
Figure 6C:
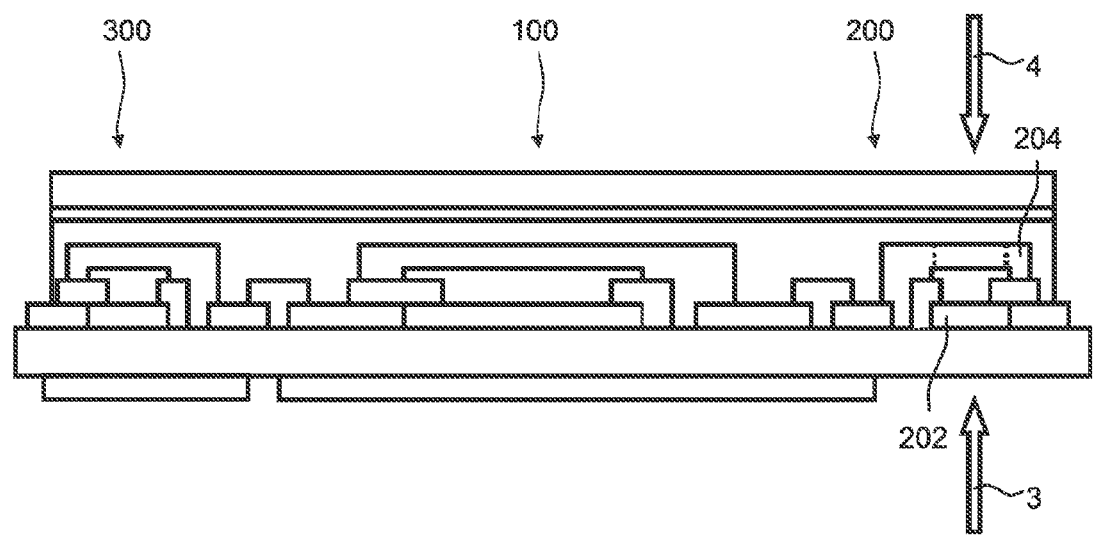

FIGS. 6A to 6C show various exemplary embodiments in which the different detection directions for the first organic light detecting element 200 are elucidated again, said element being embodied purely by way of example as an organic photodiode as in the exemplary embodiment in FIGS. 2A and 2B. In these exemplary embodiments, the organic light emitting element 100 is embodied as a bottom emitter and emits light only through the common substrate. As an alternative thereto, the organic light emitting element 100 in the exemplary embodiments described below can, however, also be embodied as a top emitter, wherein here the side with the cover, that is to say the opposite side of the organic optoelectronic component relative to the substrate, forms the emission side. Furthermore, the organic light emitting element 100 can also be embodied as a transparent OLED which emits light on both sides.

In the exemplary embodiment in FIG. 6A, the first organic light detecting element 200 has a transparent electrode 202 on the emission side, that is to say on that side of the organic functional layer stack which faces the substrate, while the top electrode 204 arranged opposite is embodied as reflective or at least non-transparent, as indicated by the hatching. By way of example, the transparent electrode 202 can be formed by a TCO or a transparent metal, that is to say a sufficiently thin metal layer, or a combination and/or a plurality thereof, while the non-transparent electrode 204 can be formed, for example, by a non-transparent metal, that is to say a sufficiently thick metal layer. With regard to an organic light emitting element 100 embodied as a bottom emitter, the organic light detecting element 200 of the exemplary embodiment in FIG. 6A is therefore designed to detect ambient light 3 which is radiated onto the organic optoelectronic component on the emission side, such that the emission side of the organic optoelectronic component in the bottom emitter configuration or else in a transparent embodiment corresponds to the detection side of the first organic light detecting element 200.

FIG. 6B shows one exemplary embodiment of an organic optoelectronic component in which, in contrast to the previous exemplary embodiment, the bottom electrode 202, that is to say the electrode arranged on the substrate side, is embodied as non-transparent and reflective, for example, as is indicated by the hatching, while the top electrode 204 arranged on the opposite side relative to the substrate is embodied as transparent or light-transmissive at least in partial regions, such that the first organic light detecting element 200 in this exemplary embodiment is designed to detect ambient light 4 which is radiated onto the organic optoelectronic component from the opposite side relative to the substrate. The detection side of the first organic light detecting element 200 thus differs from the emission side of the organic optoelectronic component in the bottom emitter configuration.

The top electrode 204 can comprise, for example, a transparent material such as a TCO, for instance. Alternatively or additionally, it may also be possible for the top electrode 204 to be embodied as a ring contact and to have, for example, an opening above the organic functional layer stack of the first organic light detecting element 200, as is indicated by the dashed lines. Such an opening can be completely enclosed by electrode material in a lateral direction, such that the electrode 204 can be embodied as a complete ring. Furthermore, it is also possible for an electrode 204 embodied as a ring contact to enclose the opening only in a partial region in a lateral direction and thus to be embodied in a U-shaped fashion, for example.

FIG. 6C shows a further exemplary embodiment of an organic optoelectronic component in which both electrodes 202, 204 are embodied as transparent and/or as ring contact, such that the first organic light detecting element 200 shown in FIG. 6C can detect ambient light 3, 4 which is radiated onto the organic optoelectronic component from both sides.

As an alternative to non-transparent electrode materials, it is also possible to use transparent electrode materials in combination with a non-transparent additional material, for example, a non-transparent insulator material, wherein the additional, non-transparent material can shade the organic material of the first organic light detecting element 200 from ambient light.

Figure 7:
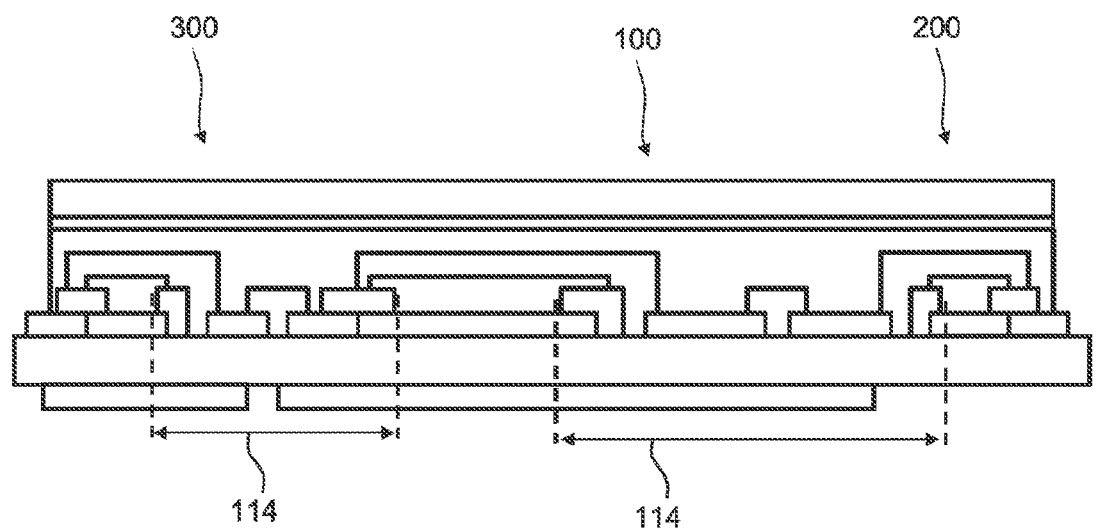

FIG. 7 shows a further exemplary embodiment in which the respective lateral distance 114 between the organic light emitting element 100 and the organic light detecting elements 200, 300 is changed in comparison with the previous exemplary embodiments. In particular, the distances 114 are chosen such that the distance 114 between the organic light emitting element 100 and the first organic light detecting element 200 is greater than the distance 114 between the organic light emitting element 100 and the second organic light detecting element 300. By way of a variation of the distance 114 it is possible, as also described above in association with FIGS. 2A and 2B, depending on the application, to influence the respective portion of the light guided internally from the organic light emitting element 100 to the first organic light detecting element 200 and to the second organic light detecting element 300. By way of example, an increase in the distance 114 between the organic light emitting element 100 and the first organic light detecting element 200 can result in a reduction of the light guided internally to the first organic light detecting element 200.

Figure 8A:
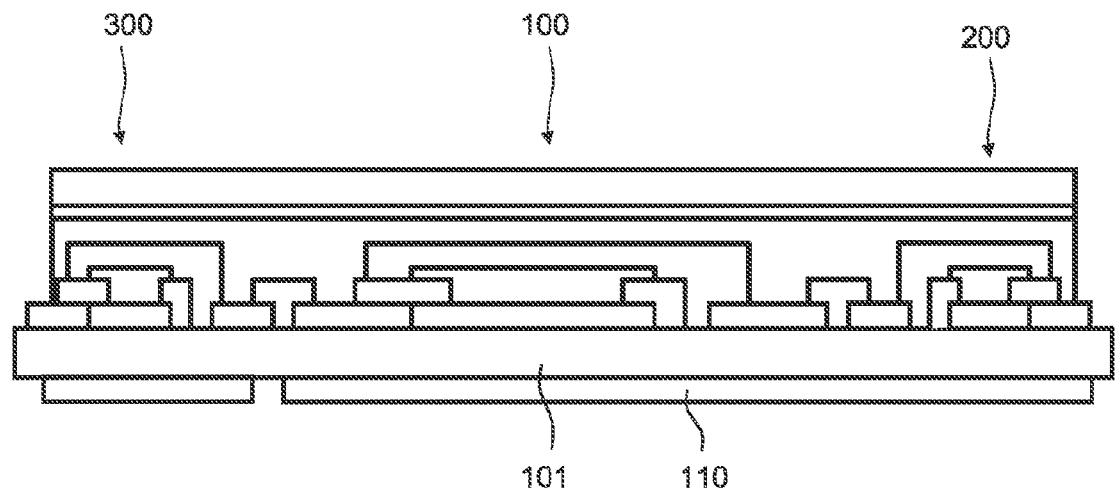
Figure 8B:
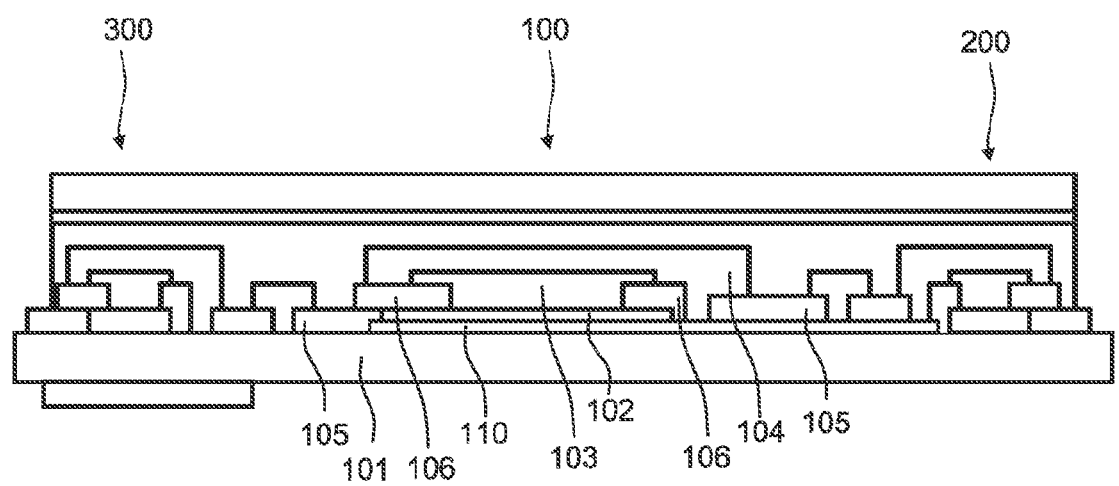

FIGS. 8A and 8B show further exemplary embodiments in which the coupling-out layer 110 is varied in comparison with the exemplary embodiments shown previously.

In the exemplary embodiment in accordance with FIG. 8A, the coupling-out layer 110 additionally also extends over the first organic light detecting element 200, as a result of which, for example, the portion of the light guided internally from the organic light emitting element 100 to the first organic light detecting element 200 and/or the portion of the ambient light coupled in can be varied.

In the exemplary embodiment in accordance with FIG. 8B, the coupling-out layer 110 is arranged on that side of the common substrate 101 which faces the organic functional layer stacks, which can likewise result in influencing of the internally guided light and also of the ambient light coupled into the first organic light detecting element 200.

As an alternative to the exemplary embodiments shown, a coupling-out layer can also be situated only above the first organic light detecting element 200 or it is also possible for no coupling-out layer to be present. If the organic optoelectronic component, and in particular the organic light emitting element 100, is embodied as a top emitter or as a transparent OLED instead of a bottom emitter, one or a plurality of coupling-out layers in the variants described can also be arranged on the side facing away from the substrate, that is to say, for example, on the encapsulation. In particular, one or a plurality of coupling-out layers can be arranged externally, that is to say on an outer side, or internally, that is to say between other layers of the organic optoelectronic component.

Figure 9A:
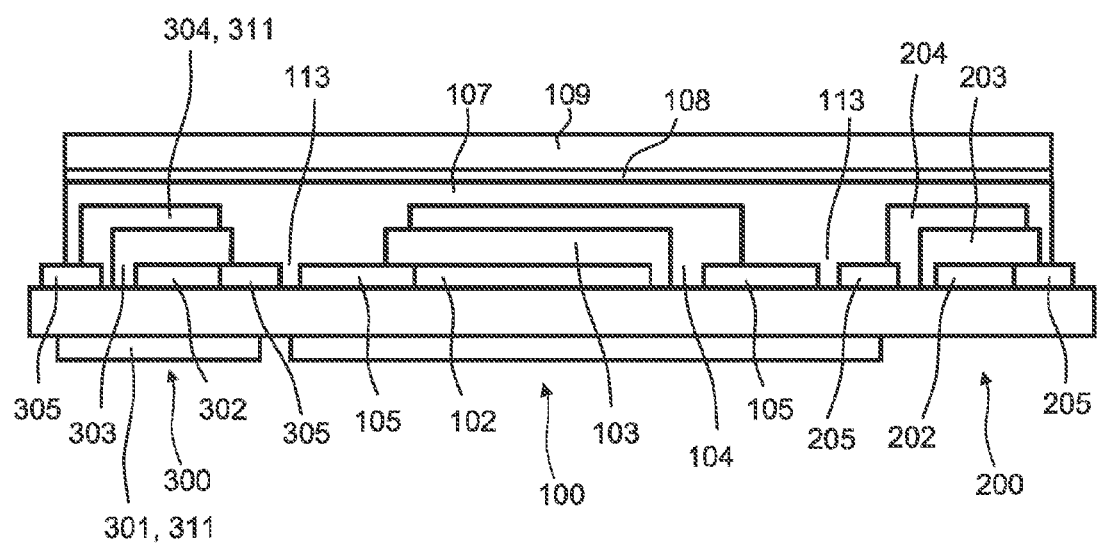
Figure 9B:
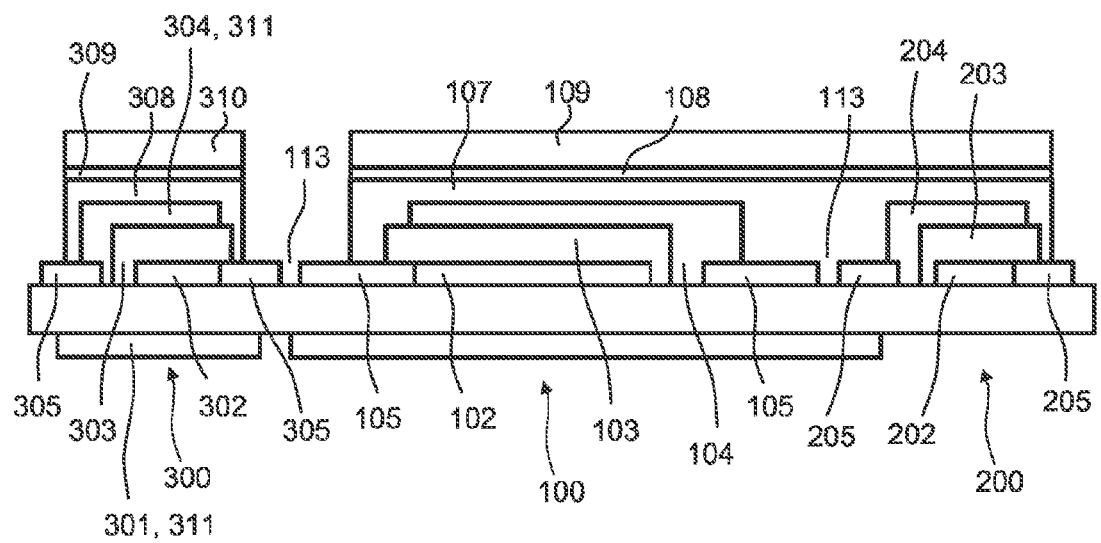

FIGS. 9A and 9B show further exemplary embodiments of organic optoelectronic components having a common encapsulation 107 and having partly separate encapsulations 107, 308, in which, in comparison with the exemplary embodiments shown previously, no insulator layers 106, 206, 306, 112 are present. As a result, as already described in association with FIG. 3 in relation to the interspace 113 instead of an insulator layer 112, the portion of the light guided internally from the organic light emitting element 100 to the organic light detecting elements 200, 300 can be influenced, which light, depending on the position, geometry and choice of material of the respective top electrode 204, 304 can be radiated internally in the organic optoelectronic component, for example, also directly from the organic light emitting element 100 onto the first and/or second organic light detecting element 200, 300. The electrodes 102, 104, 202, 204, 302, 304 are formed, for example, by means of suitable mask processes during production in such a way that no short circuits arise even without insulator layers 106, 206, 306, 112 and the thus partially open organic layers.

FIGS. 10A to 15E show, in plan views of the emission side of the organic optoelectronic component, variation possibilities for the arrangement, the number and the position of organic light detecting elements 200, 200', 200", 300 in relation to one or more light emitting elements 100 in accordance with a plurality of exemplary embodiments, wherein, for the sake of clarity, only the positions of the organic light emitting elements 100 and of the organic light detecting elements 200, 200', 200", 300 are indicated, without exact illustration of the luminous area and the contact feeds. In the case of a plurality of second organic light detecting elements 300 in the following exemplary embodiments, each of the second organic light detecting elements 300 comprises at least one organic light detecting layer arranged between two non-transparent layers, which shade the respective at least one organic light detecting layer from ambient light. The respective non-transparent layers can be embodied identically or differently for the individual second organic light detecting elements 300.

The first organic light detecting elements 200 shown in FIGS. 10A to 10F are embodied identically in each case and can detect ambient light on one side or on both sides in accordance with the previous exemplary embodiments.

Figure 10A:
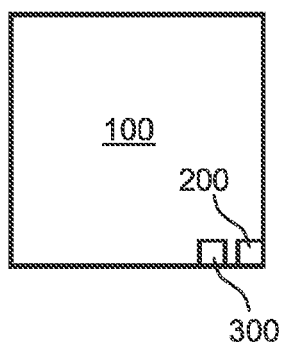
Figure 10B:
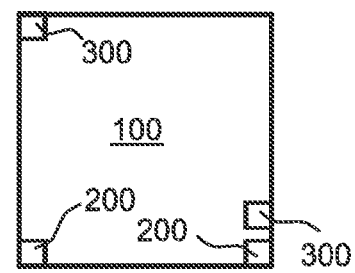
Figure 10C:
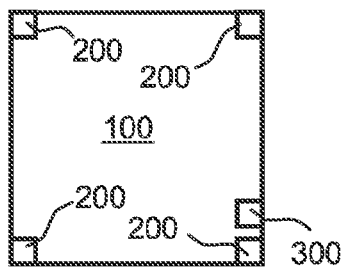

As is shown in FIG. 10A, by way of example, a first organic light detecting element 200 and a second organic light detecting element 300 can be situated in a corner or more generally in an edge region of an organic light emitting element 100, as a result of which the least possible influencing of the luminous area of the organic optoelectronic component can be achieved. As is shown in FIGS. 10B and 10C, a plurality of first and/or second organic light detecting elements 200, 300 can also be present, for example, for a plurality of corners of the organic light emitting element 100.

Figure 10D:
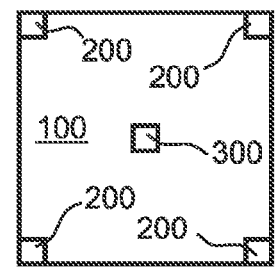
Figure 10E:
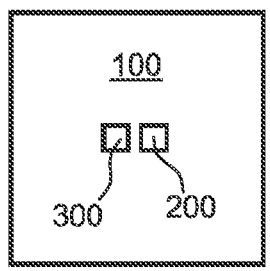

Furthermore, it is also possible, as is shown in FIGS. 10D and 10E, that in addition or as an alternative to edge regions a first and/or second organic light detecting element 200, 300 are/is also arranged within the luminous area formed by the organic light emitting element 100.

Figure 10F:
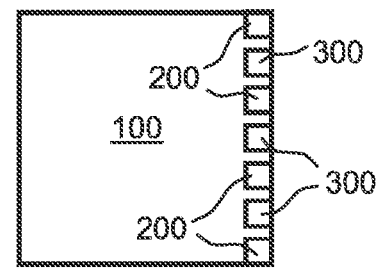
Figure 11A:
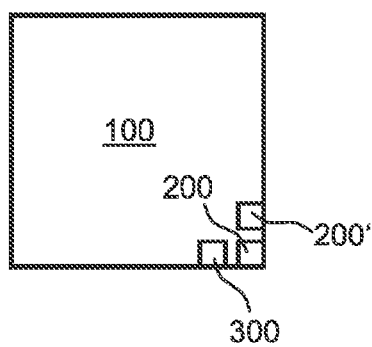
Figure 11B:
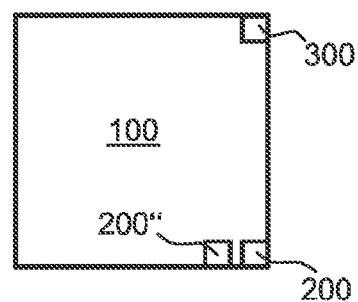
Figure 11C:
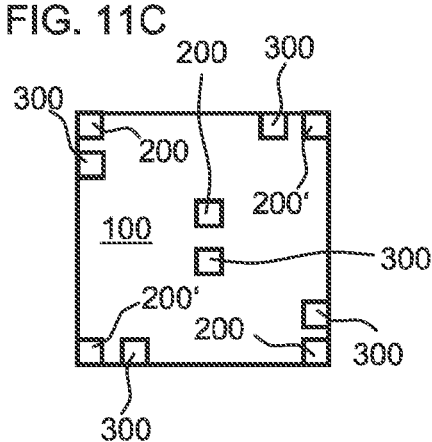
Figure 11D:
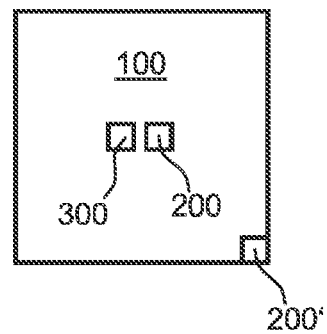
Figure 11E:
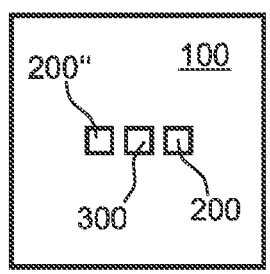
Figure 11F:
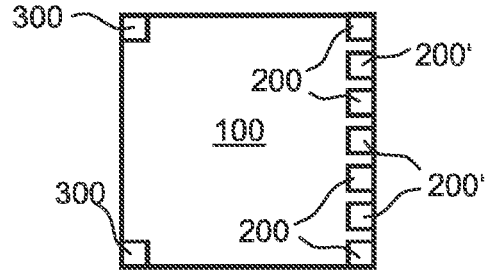
Figure 12A:
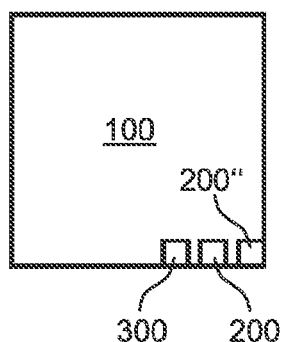
Figure 12B:
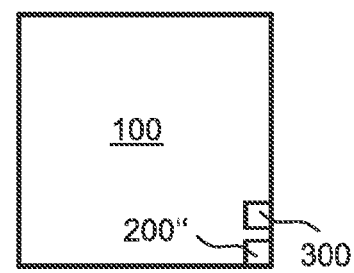
Figure 12C:
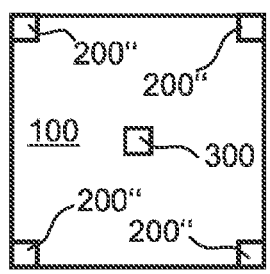
Figure 12D:
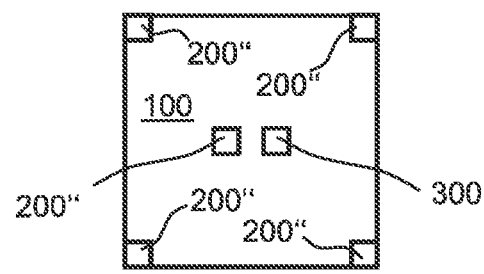
Figure 12E:
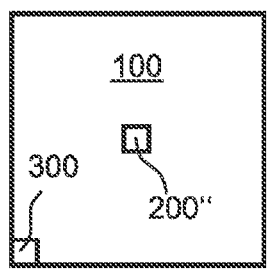
Figure 12F:
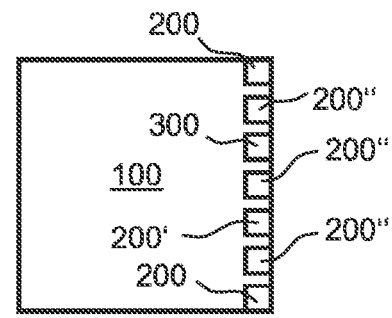

As is shown in FIG. 10F, by way of example, an entire edge side of an organic light emitting element 100 can also be provided with a multiplicity of organic light detecting elements 200, 300.

FIGS. 11A to 12F show exemplary embodiments in which together with second organic light detecting elements 300 first organic light detecting elements 200, 200', 200" are provided, which have different detection sides. Purely by way of example, the first organic light detecting elements 200 have a detection side which enables detection of ambient light through the substrate, while the first organic light detecting elements 200' enable detection of ambient light which is radiated onto the organic optoelectronic component on the side facing away from the substrate. The first organic light detecting elements 200" are provided for detection on both sides.

FIGS. 11A to 11F show exemplary possibilities of combinations of first organic light detecting elements 200, 200' and second organic light detecting elements 300 in arrangements similar to the exemplary embodiments in FIGS. 10A to 10F, while FIGS. 12A to 12F show possibilities of combinations of first organic light detecting elements 200, 200', 200" and second organic light detecting elements 300.

By means of a plurality of suitably selected first organic light detecting elements 200, 200', 200", 300, an independent identification of the front- and rear-side ambient illumination and of the internal luminous intensity may be possible. Furthermore, by means of a plurality of second organic light detecting elements 300, a measurement of the uniformity of the luminous area of the organic light emitting element 100 may also be possible. An individual illumination control can thus be achieved. Furthermore, it may also be possible that a position sensor, for example, can be realized by means of a suitable choice and number of first organic light detecting elements 200, 200', 200".

FIGS. 13A to 15E show further exemplary embodiments of the arrangement, the number and the geometrical configuration of one or a plurality of light emitting elements 100 and one or a plurality of light detecting elements. In each case only identical first organic light detecting elements 200 are illustrated here, for the sake of clarity. However, the shown exemplary embodiments of arrangements, numbers and geometrical configurations also hold true for different first organic light detecting elements 200, 200', 200" and in particular also for second organic light detecting elements 300, and so the exemplary embodiments in FIGS. 13A to 15E should be understood in combination with the previous exemplary embodiments. In this regard, the exemplary embodiments shown in FIGS. 10A to 15E can be combined with one another arbitrarily depending on the application of the organic optoelectronic component.

As is shown in FIG. 13A, the size of an organic light detecting element can be varied, for example, in comparison with the previous exemplary embodiments. As is shown in FIG. 13B, the size and the shape of the light emitting element 100 can also be varied and can also have a rectangular or some other shape, for example, in comparison with the square shapes shown previously. As is shown in FIG. 13C, an organic light detecting element can also extend continuously over an entire edge side of an organic light emitting component 100. As is shown in FIGS. 13D and 13E, an organic light detecting element can, for example, be arranged in a region enclosed by the organic light emitting element 100 or subdivide a light emitting element 100 into two regions.

Figure 14C:
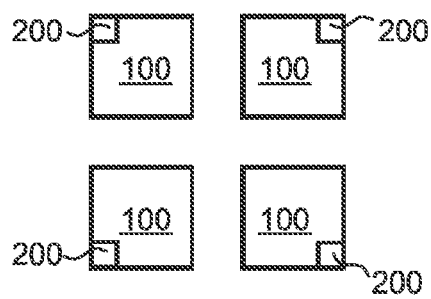
Figure 14D:
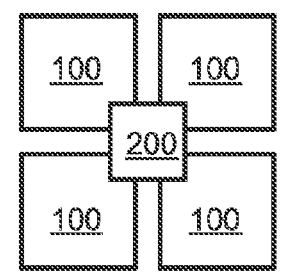
Figure 15A:
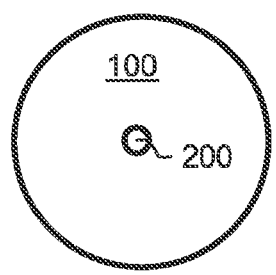
Figure 15B:
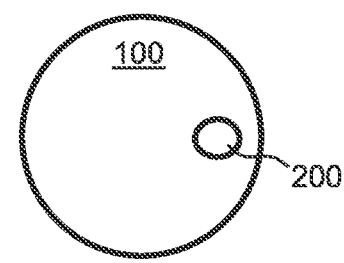
Figure 15C:
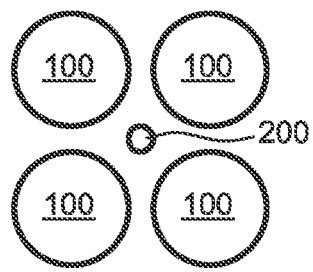
Figure 15D:
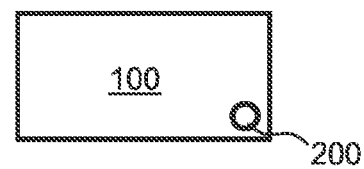
Figure 15E:
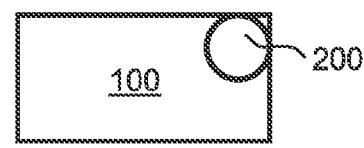

Furthermore, it is also possible that, as is shown in FIGS. 14A and 14B, a plurality of organic light emitting elements 100 are provided, wherein an organic light detecting element can be spaced apart from the plurality of organic light emitting elements 100 or can be assigned directly to one of the organic light emitting elements 100. In the exemplary embodiment in FIG. 14C, in contrast thereto, each of the plurality of light emitting elements 100 is assigned an organic light detecting element, which can be in particular identical or different, while in accordance with the exemplary embodiment in FIG. 14D an organic light detecting element is provided which, in comparison with the previous exemplary embodiments, occupies a larger area and is assigned to all of the plurality of light emitting elements 100.

As is shown in FIGS. 15A to 15E, the organic light emitting elements 100 and/or the organic light detecting elements can also have a shapes deviating from an angular shape, for example, a circular shape, an elliptic shape or any other shape and any other relative arrangement and size with respect to one another.

Figure 16:
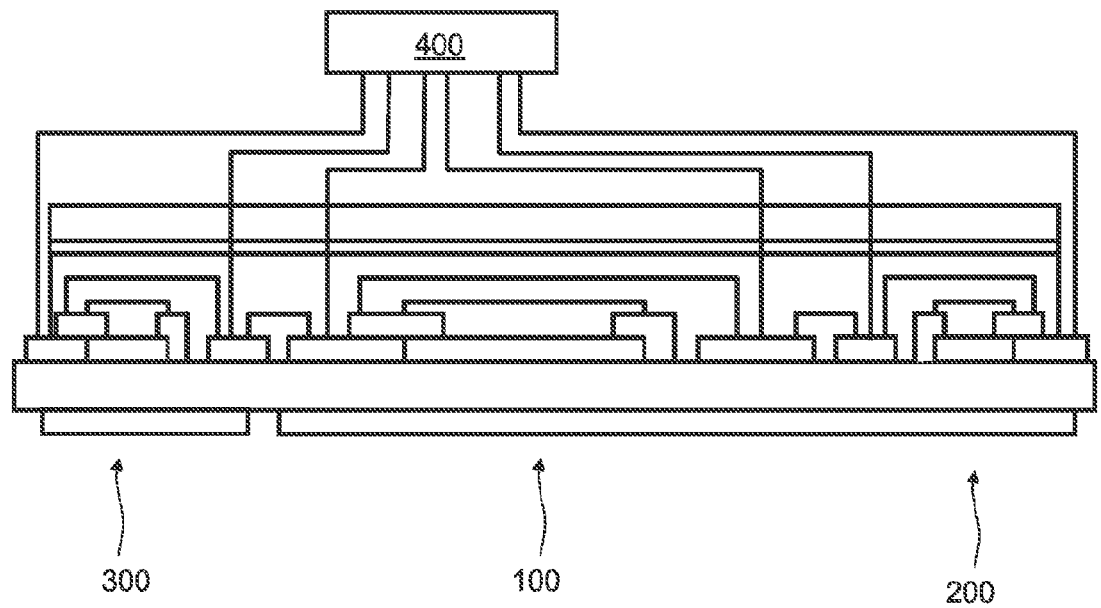
FIGS. 16 and 17 show schematic illustrations of organic optoelectronic components in accordance with further exemplary embodiments.
Figure 17:
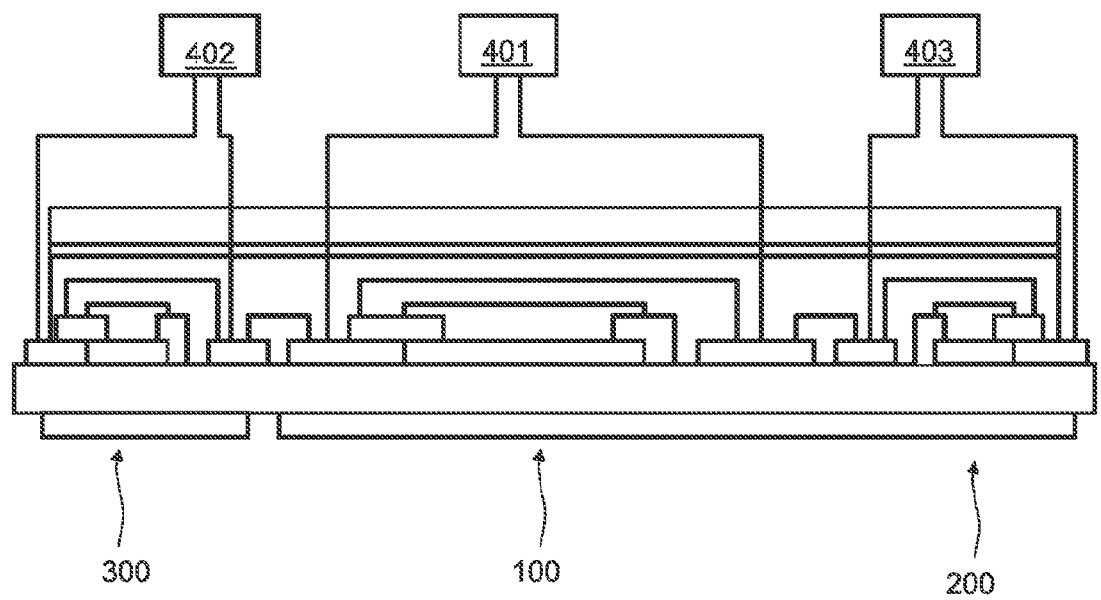

FIGS. 16 and 17 show organic optoelectronic components in accordance with further exemplary embodiments which comprise electronic components for electrical interconnections of the at least one organic light emitting element 100, the at least one first organic light detecting element 200 and the at least one second organic light detecting element 300.

Purely by way of example, FIGS. 16 and 17 show organic optoelectronic components having a common encapsulation for the elements 100, 200, 300. The interconnection possibilities shown in FIGS. 16 and 17 can also be combined with the other exemplary embodiments.

In the exemplary embodiment in FIG. 16, a regulatable current and/or voltage source 400 is provided as electronic component and measures the electrically measurable signal which is provided by the at least one first organic light detecting element 200 and which is generated by light comprising ambient light. Furthermore, the electronic component measures the electrically measurable signal which is provided by the at least one second organic light detecting element 300 and which is generated by the light guided internally in the organic optoelectronic component from the organic light emitting element 100 to the organic light detecting element 300. Depending on the measurements, the electronic component regulates the at least one organic light emitting element 100. The exemplary embodiment shown in FIG. 16 makes it possible, in particular, to carry out a method for operating an organic optoelectronic component, wherein a regulatable current and/or voltage source 400 is provided, which measures the light which is detected by the at least one first organic light detecting element 200 and which comprises ambient light, and which measures the light which is detected by the at least one second organic light detecting element 300 and which comprises light guided internally in the organic optoelectronic component from the at least one organic light emitting element 100 to the at least one organic light detecting element 300, and which regulates the at least one organic light emitting element 100 depending on the measurements. The regulatable current and/or voltage source 400 can operate, for example, with regulatable current and/or voltage amplitudes, a pulse width modulation method and/or a pulse frequency modulation method.

As is shown in FIG. 16, the regulatable current and/or voltage source 400 can be an external electronic component which is interconnected with the elements 100, 200, 300 via suitable wire connections or conduction tracks. As an alternative thereto, it may also be possible to integrate a regulatable current and/or voltage source at least partly into the organic optoelectronic component, for example, by integration into the common substrate or by arrangement on the common substrate. In other words, the regulatable current and/or voltage source 400 can be provided as a monolithic electronic circuit, for example, in the substrate or in additional functional layers on the substrate. The regulatable current and/or voltage source 400 can have presetting possibilities which enable, for example, a desired brightness to be set depending on the ambient light of the optoelectronic component.

FIG. 17 shows one exemplary embodiment of an organic optoelectronic component which comprises, instead of a regulatable current and/or voltage source 400 that converts the measurement signal provided by the organic light detecting elements 200, 300 into a control signal for the organic light emitting element 100, a current and/or voltage source 401 separate from respective current and/or voltage measuring instruments 402, 403, which enable operation of the organic optoelectronic component without direct feedback, wherein the signal of the organic light detecting elements 200, 300 is merely measured in each case.

The features and exemplary embodiments described in association with the figures can be combined with one another in accordance with further exemplary embodiments, even if such combinations are not explicitly described with the individual figures. Furthermore, the exemplary embodiments shown in the figures can have further or alternative features in accordance with the general description.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic optoelectronic component comprising:
   at least one organic light emitting element comprising an organic functional layer stack having at least one organic light emitting layer between two electrodes;
   at least one first organic light detecting element comprising at least one first organic light detecting layer; and
   at least one second organic light detecting element comprising at least one second organic light detecting layer,
   wherein the at least one organic light emitting element, the at least one first organic light detecting element and the at least one second light detecting element are arranged laterally adjacent on a common substrate,
   wherein the at least one first organic light detecting element is configured to detect ambient light,
   wherein the at least one second organic light detecting layer of the at least one second organic light detecting element is arranged between two non-transparent layers, the two non-transparent layers shade the at least one second organic light detecting layer of the at least one second organic light detecting element from ambient light, and
   wherein one of the two non-transparent layers is formed by the common substrate.

2. The optoelectronic component according to claim 1, wherein at least one of the two non-transparent layers comprises a non-transparent covering layer, which is arranged on a side of the common substrate that faces away from the at least one second organic light detecting layer of the at least one second light detecting element.

3. The optoelectronic component according to claim 1, wherein the common substrate comprises a metal layer.

4. The optoelectronic component according to claim 1, wherein at least one of the non-transparent layers comprises an electrode of the at least one second organic light detecting element.

5. The optoelectronic component according to claim 4, wherein the electrode comprising a non-transparent layer is arranged on a side of the at least one second organic light detecting layer of the at least one second light detecting element which faces away from the common substrate.

6. The optoelectronic component according to claim 1, wherein one of the two non-transparent layers comprises at least one part of an encapsulation and/or of a cover which, as viewed from the common substrate, is arranged above the at least one second organic light detecting layer of the at least one second light detecting element.

7. The optoelectronic component according to claim 1, wherein the common substrate forms an optical waveguide configured to guide light from the at least one light emitting element internally in the optoelectronic component to the at least one second light detecting element.

8. The optoelectronic component according to claim 1, wherein light generated during operation in the at least one light emitting layer of the at least one light emitting element is radiated internally in the optoelectronic component directly onto the at least one second light detecting layer of the at least one second light detecting element.

9. The optoelectronic component according to claim 1, wherein the at least one first organic light detecting element is configured to detect ambient light through the substrate.

10. The optoelectronic component according to claim 1, wherein the at least one first organic light detecting element is configured to detect ambient light which is radiated onto the organic optoelectronic component from an opposite side of the organic optoelectronic component relative to the substrate.

11. The optoelectronic component according to claim 1, wherein the at least one organic light emitting element is configured to emit light on an emission side of the organic optoelectronic component, and wherein the at least one first organic light detecting element is configured to detect ambient light which is radiated onto the organic optoelectronic component on a different side than the emission side.

12. The optoelectronic component according to claim 1, wherein the at least one organic light emitting element is configured to emit light on an emission side of the organic optoelectronic component, and wherein the at least one first organic light detecting element is configured to detect ambient light which is radiated onto the organic optoelectronic component on the emission side.

13. The optoelectronic component according to claim 1, wherein a lateral distance between the at least one organic light emitting element and the at least one first organic light detecting element is greater than a lateral distance between the at least one organic light emitting element and the at least one second organic light detecting element.

14. The optoelectronic component according to claim 1, wherein the at least one first organic light detecting element and/or the at least one second organic light detecting element comprises an organic photodiode, an organic photoconductor and/or an organic photoresistor.

15. The optoelectronic component according to claim 1, wherein a plurality of first organic light detecting elements each configured to detect ambient light is arranged on the common substrate.

16. The optoelectronic component according to claim 1, wherein a plurality of second organic light detecting elements are arranged on the common substrate, wherein each of the plurality of second organic light detecting elements comprises at least one second organic light detecting layer arranged between two non-transparent layers, which shade the respective at least one organic light detecting layer from ambient light.

17. An organic optoelectronic component comprising:
 at least one organic light emitting element comprising an organic functional layer stack having at least one organic light emitting layer between two electrodes;
 at least one first organic light detecting element comprising at least one first organic light detecting layer; and
 at least one second organic light detecting element comprising at least one second organic light detecting layer,
 wherein the at least one organic light emitting element, the at least one first organic light detecting element and the at least one second light detecting element are arranged laterally adjacent on a common substrate,
 wherein the at least one first organic light detecting element is configured to detect ambient light,
 wherein the at least one second organic light detecting layer of the at least one second organic light detecting element is arranged between two non-transparent layers, the two non-transparent layers shade the at least one second organic light detecting layer of the at least one second organic light detecting element from ambient light, and
 wherein a lateral distance between the at least one organic light emitting element and the at least one first organic light detecting element is greater than a lateral distance between the at least one organic light emitting element and the at least one second organic light detecting element.

18. A method for operating an organic optoelectronic component, wherein the optoelectronic component comprises:
 at least one organic light emitting element comprising an organic functional layer stack having at least one organic light emitting layer between two electrodes;
 at least one first organic light detecting element comprising at least one first organic light detecting layer; and
 at least one second organic light detecting element comprising at least one second organic light detecting layer,
 wherein the at least one organic light emitting element, the at least one first organic light detecting element and the at least one second light detecting element are arranged laterally adjacent on a common substrate,
 wherein the at least one first organic light detecting element is configured to detect ambient light,
 wherein the at least one second organic light detecting layer of the at least one second organic light detecting element is arranged between two non-transparent layers, the two non-transparent layers shade the at least one second organic light detecting layer of the at least one second organic light detecting element from ambient light,
 wherein one of the two non-transparent layers comprises the common substrate,
 and wherein the method comprises:
 applying a current and/or voltage to the optoelectronic component;
 detecting and measuring ambient light by the at least one first organic light detecting element;
 detecting and measuring internally guided light by the at least one second organic light detecting element, wherein the internally guided light comprises light guided internally in the optoelectronic component from the at least one light emitting element to the at least one light detecting element; and
 regulating the at least one organic light emitting element by regulating the current and/or voltage based on the measurement.

19. A method for operating an organic optoelectronic component, wherein the optoelectronic component comprises:
 at least one organic light emitting element comprising an organic functional layer stack having at least one organic light emitting layer between two electrodes;
 at least one first organic light detecting element comprising at least one first organic light detecting layer; and
 at least one second organic light detecting element comprising at least one second organic light detecting layer,
 wherein the at least one organic light emitting element, the at least one first organic light detecting element and the at least one second light detecting element are arranged laterally adjacent on a common substrate, wherein the at least one first organic light detecting element is configured to detect ambient light,
- wherein the at least one second organic light detecting layer of the at least one second organic light detecting element is arranged between two non-transparent layers, the two non-transparent layers shade the at least one second organic light detecting layer of the at least one second organic light detecting element from ambient light,
- wherein a lateral distance between the at least one organic light emitting element and the at least one first organic light detecting element is greater than a lateral distance between the at least one organic light emitting element and the at least one second organic light detecting element, and
- wherein the method comprises:
- applying a current and/or voltage to the optoelectronic component;
- detecting and measuring ambient light by the at least one first organic light detecting element;
- detecting and measuring internally guided light by the at least one second organic light detecting element, wherein the internally guided light comprises light guided internally in the optoelectronic component from the at least one light emitting element to the at least one light detecting element; and
- regulating the at least one organic light emitting element by regulating the current and/or voltage based on the measurement.

* * * * *